United States Patent
Tanaka

(10) Patent No.: US 7,327,070 B2
(45) Date of Patent: Feb. 5, 2008

(54) LAMB-WAVE HIGH-FREQUENCY RESONATOR

(75) Inventor: Satoru Tanaka, Chino (JP)

(73) Assignee: Seiko Epson Corporation, Tokyo (JP)

( * ) Notice: Subject to any disclaimer, the term of this patent is extended or adjusted under 35 U.S.C. 154(b) by 26 days.

(21) Appl. No.: 11/322,239

(22) Filed: Jan. 3, 2006

(65) Prior Publication Data

US 2006/0152107 A1 Jul. 13, 2006

(30) Foreign Application Priority Data

Jan. 7, 2005 (JP) ............................. 2005-002111
Oct. 5, 2005 (JP) ............................. 2005-292126

(51) Int. Cl.
*H03H 9/19* (2006.01)
*H03H 9/25* (2006.01)

(52) U.S. Cl. .............................. 310/313 A; 310/313 B; 310/361

(58) Field of Classification Search ............ 310/313 R, 310/313 A–313 D, 361
See application file for complete search history.

(56) References Cited

U.S. PATENT DOCUMENTS 5,283,037 A * 2/1994 Baer et al. ................ 422/82.01
5,440,188 A * 8/1995 Krempl et al. ........... 310/313 A
6,317,014 B1 * 11/2001 Kadota ........................ 333/133
6,378,370 B1 * 4/2002 Haskell et al. ................. 73/579
6,717,327 B2 * 4/2004 Kando et al. ............ 310/313 A
2005/0146243 A1* 7/2005 Cherednick et al. .... 310/313 A
2005/0164645 A1* 7/2005 Li et al. ........................ 455/69

FOREIGN PATENT DOCUMENTS

| JP | A 10-233645 | 9/1998 |
| JP | A 2003-258596 | 9/2003 |
| JP | 2006-217566 | * 8/2006 |

OTHER PUBLICATIONS

Y. Nakagawa et al.; "Lamb Wave Type Substrate for Elastic Wave Devices;" Interdisciplinary Graduate School of Medicine and Engineering University of Yamanashi; 33$^{rd}$ EM Symposium 2004; pp. 93-96.

Shigeo Kanna et al.; "Frequency-Temperature Analysis of Surface Acoustic Waves Using Finite Element Method"; The Institute of Electronics, Information and Communication Engineers; pp. 37-42; with partial translation; no date given.

* cited by examiner

*Primary Examiner*—Thomas M. Dougherty
(74) *Attorney, Agent, or Firm*—Oliff & Berridge, PLC

(57) ABSTRACT

A Lamb-wave high-frequency resonator includes a comb-shaped IDT electrode for exciting a Lamb wave on one main surface of a quartz substrate. The IDT electrode is formed such that the cut angle of the quartz substrate and the direction of propagation of the Lamb wave are expressed in Euler angles (0, θ, 0).

4 Claims, 17 Drawing Sheets

LAMB-WAVE HIGH-FREQUENCY RESONATOR

BACKGROUND

1. Technical Field

The present invention relates to a Lamb-wave high-frequency resonator, and in particular, it relates to a Lamb-wave high-frequency resonator including a quartz substrate and an interdigital transducer (IDT) electrode, the cut angle of the quartz substrate and the direction of propagation of Lamb wave being expressed in Euler angles (0, θ, 0).

2. Related Art

Typical high-frequency resonators include surface acoustic wave devices using a Rayleigh wave or an SH wave and a Lamb-wave resonator using a Lamb wave. As the substrates for them, an ST-cut quartz for a Rayleigh wave and an STW-cut quartz for an SH wave are adopted: for high-frequency resonators using a Lamb wave, an AT-cut quartz is used.

For example, it is known to use a Rayleigh-wave surface acoustic wave device in which an IDT electrode is formed along the Z' axis on the surface of a quartz substrate called an ST-cut quartz (e.g., refer to Nonpatent Document 1: Kanna, S., "Analysis of Frequency-Temperature Characteristic of Surface Acoustic Wave Using Finite Element Method) Technical Report of IEICE, US99-20 (199-06), pp. 37-42).

It is also known to use an SH-wave surface acoustic wave device that propagates a transverse wave in an STW-cut quartz, that is, the direction of propagation of a surface acoustic wave is shifted 90 degrees relative to the ST-cut quartz. (e.g., Patent Document 1: JP-A-10-233645, pp 3-6, FIG. 1).

It is also known to use a Lamb-wave high-frequency resonator using a Lamb wave in which an IDT electrode is formed on the surface of an AT-cut quartz substrate, which propagates a bulk wave in the quartz substrate such that it is repeatedly reflected by the upper and lower surface thereof, and in which the thickness H of the quartz substrate and the wavelength λ of the Lamb wave are expressed as 0<2H/λ≦10 (e.g., refer to Nonpatent Document 2: Nakagawa, Y., Momose, M., Kakio, S., "Lamb-Wave Surface Acoustic Wave Device Substrate" 33$^{rd}$ EM symposium 2004, pp. 93-96 and Patent Document 2: JP-A-2003-258596)).

According to Nonpatent Document 1, the frequency variation with temperature is about 140 ppm in a temperature range from –40° C. to 90° C., exhibiting an excellent frequency temperature characteristic as a surface acoustic wave device, but it is not sufficient as a resonator for which high accuracy is required. This surface acoustic wave device has a theoretical phase velocity of about 3100 m/s, which is difficult to provide for high-frequency bands.

The surface acoustic wave device according to Patent Document 1 is an end-reflecting surface wave device using an SH wave, whose frequency variation with temperature is 254 ppm in a temperature range from –40° C. to 90° C., exhibiting a lower frequency temperature characteristic than that of the foregoing ST-cut quartz. The device uses tantalum or tungsten having a density higher than that of aluminum as an electrode material to improve the frequency temperature characteristic. However, this has the problems of increasing electrical ohmic loss to further decrease the phase velocity.

The resonator according to Patent Document 2 uses an AT-cut quartz substrate whose thickness is smaller than the wavelength of an acoustic wave by five wavelengths, so that it has an excellent frequency temperature characteristic, thus providing for high frequencies. However, Nonpatent Document 2 exhibits a secondary temperature coefficient equal to that of the foregoing ST-cut quartz, and a frequency temperature characteristic of 320 ppm in a temperature range from –40° C. to 90° C., which is not better than that of the ST-cut quartz with low satisfaction.

SUMMARY

An advantage of some aspects of the invention is to provide a Lamb-wave high-frequency resonator that provides high frequency waves and has an excellent frequency temperature characteristic and which can reduce the manufacturing cost.

According to an aspect of the invention, a Lamb-wave high-frequency resonator is provided which has a comb-shaped IDT electrode for exciting a Lamb wave on one main surface of a quartz substrate. The IDT electrode is formed such that the cut angle of the quartz substrate and the direction of propagation of the Lamb wave are expressed in Euler angles (0, θ, 0).

The invention uses a Lamb wave that propagates in such a manner that it is repeatedly reflected by the upper and lower surface of a quartz substrate, providing high frequencies. Also, the cut angle of the quartz substrate is simple, because the cut angle and the direction of propagation of the Lamb wave are expressed in Euler angles (0, θ, 0). This facilitates manufacturing the quartz substrate, thus reducing manufacturing cost.

It is preferable that the relationship between the thickness t of the quartz substrate and the wavelength λ of the Lamb wave be set within the range expressed as 0<t/λ≦3.

Here, t/λ is called a standardized substrate thickness.

The quartz substrate expressed in Euler angles (0, θ, 0) has multiple vibration modes, as will be specifically described with reference to the following embodiment. The modes are easily coupled, because the frequency bands of the modes come close to one another when the thickness of the quartz substrate increases. The mode coupling can be prevented to allow selection of a single mode by setting the standardized substrate thickness t/λ to a proper value smaller than 3. This offers the advantages of providing stable frequency characteristics and high frequencies.

It is preferable that the relationship between the thickness t of the quartz substrate and the wavelength λ of the Lamb wave be set within the range expressed as 1.1≦t/λ≦3 when the angle θ is within the range of 132.8≦θ≦178 degrees.

It is preferable that the relationship between the thickness t of the quartz substrate and the wavelength λ of the Lamb wave be set within the range expressed as 2.08≦t/λ≦2.82 when the angle θ is within the range of 4≦θ≦57.5 degrees.

It is preferable that the relationship between the thickness t of the quartz substrate and the wavelength λ of the Lamb wave be set within the range expressed as 0.975≦t/λ≦2.025 when the angle θ is within the range of 6≦θ≦33 degrees.

It is preferable that the relationship between the thickness t of the quartz substrate and the wavelength λ of the Lamb wave be set within the range expressed as 0.176≦t/λ≦1.925 when the angle θ is within the range of 35≦θ≦47.2 degrees.

It is preferable that the relationship between the thickness t of the quartz substrate and the wavelength λ of the Lamb wave be set within the range expressed as 2.878≦t/λ≦3 when the angle θ is within the range of 2.7≦θ≦16 degrees.

It is preferable that the relationship between the thickness t of the quartz substrate and the wavelength λ of the Lamb wave be set within the range expressed as $0.375 \leq t/\lambda \leq 1.06$ when the angle $\theta$ is within the range of $116 \leq \theta \leq 122.1$ degrees.

The frequency temperature characteristic, the frequency band, and the stability of excitation of the Lamb-wave high-frequency resonator are determined by the cut angle of the quartz substrate and the direction of propagation of elastic waves, that is, the angle $\theta$ of Euler angles $(0, \theta, 0)$, the substrate thickness t, and the wavelength $\lambda$, which will be described in detail. Satisfying the foregoing relational expressions provides a frequency temperature characteristic higher than that of the related-art STW-cut quartz and ST-cut quartz, allows provision for high-frequency bands, and increases the electromechanical coupling factor ($K^2$) indicative of the efficiency of excitation of the quartz substrate. Accordingly, a Lamb-wave high-frequency resonator that facilitates excitation and having stable frequency characteristics can be provided.

BRIEF DESCRIPTION OF THE DRAWINGS

The invention will be described with reference to accompanying drawings, wherein like numbers reference like elements.

DESCRIPTION OF EXEMPLARY EMBODIMENTS

Figure 1:
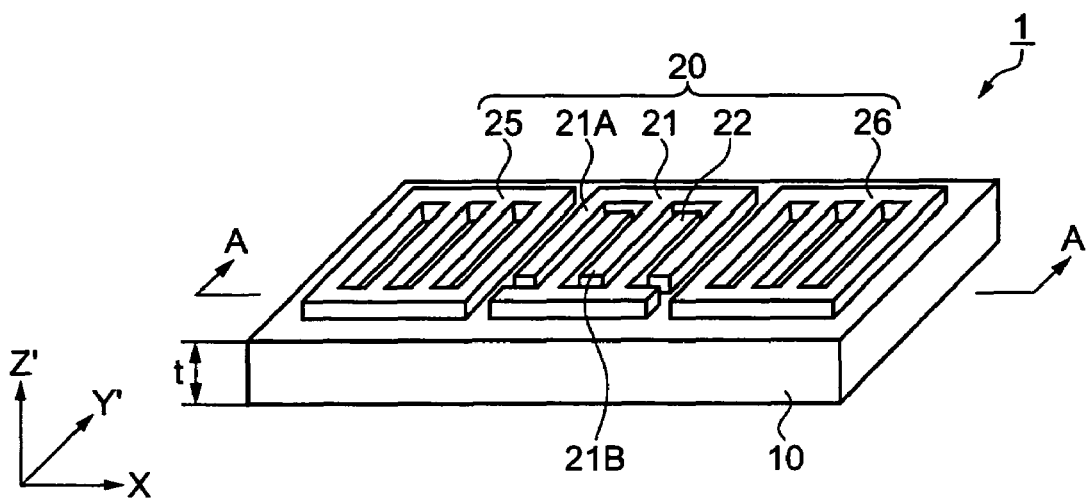
FIG. 1 is a schematic perspective view of a Lamb-wave high-frequency resonator according to an embodiment of the invention.
Figure 2:
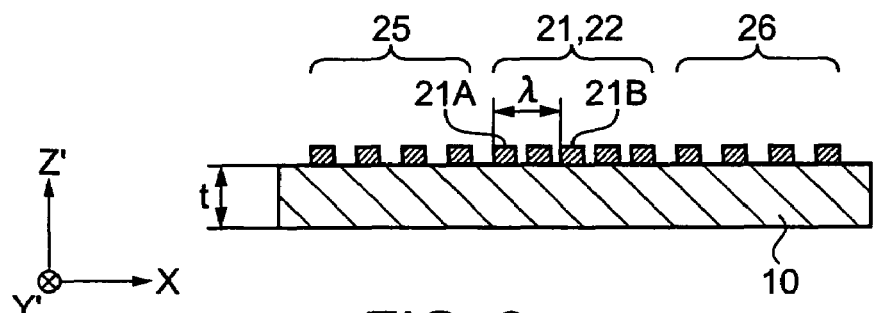
FIG. 2 is a cross-sectional view of the Lamb-wave high-frequency resonator according to the embodiment, taken along line A-A of FIG. 1.
Figure 3:
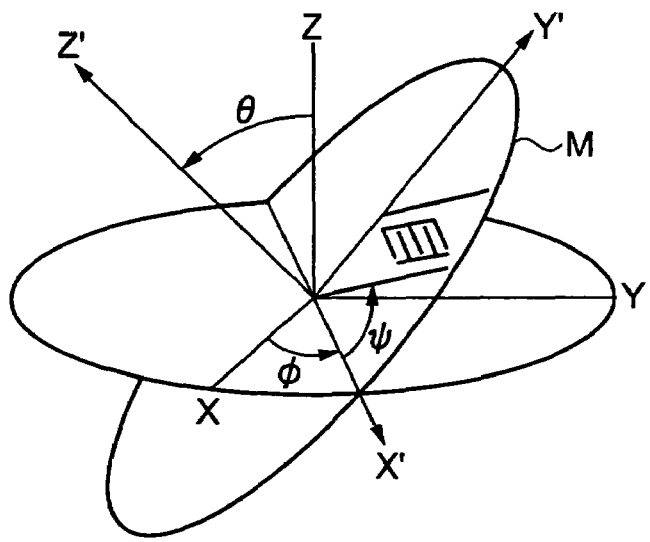
FIG. 3 is an explanatory diagram showing the cutting direction of a quartz substrate according to the embodiment.
Figure 4:
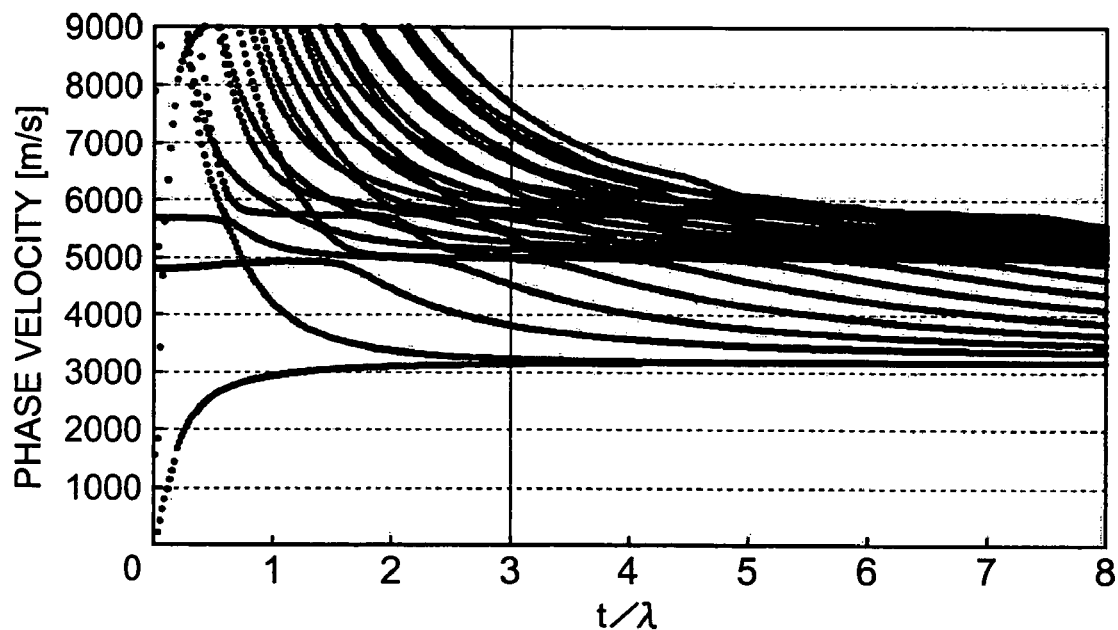
FIG. 4 is a graph showing part of the relationship between standardized substrate thickness t/$\lambda$ and phase velocity according to the embodiment.
Figure 5:
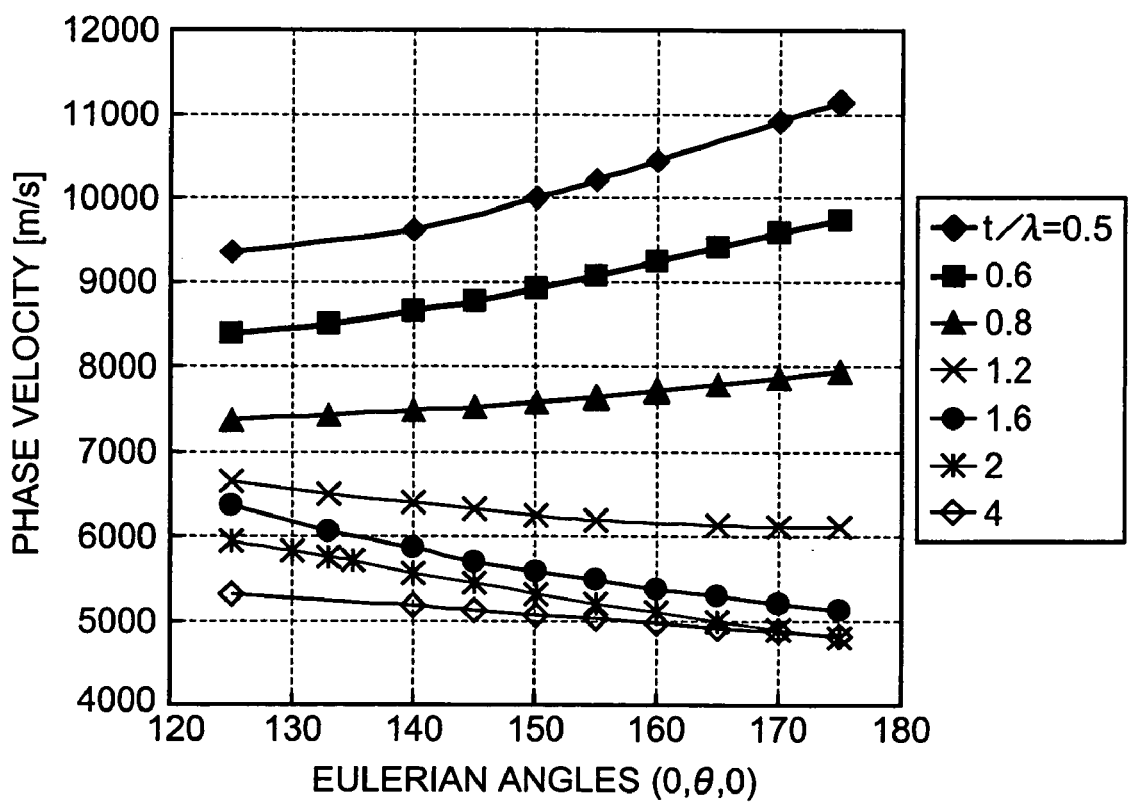
FIG. 5 is a graph showing the relationship among phase velocity, angle $\theta$, and standardized substrate thickness t/$\lambda$ according to the embodiment.
Figure 6:
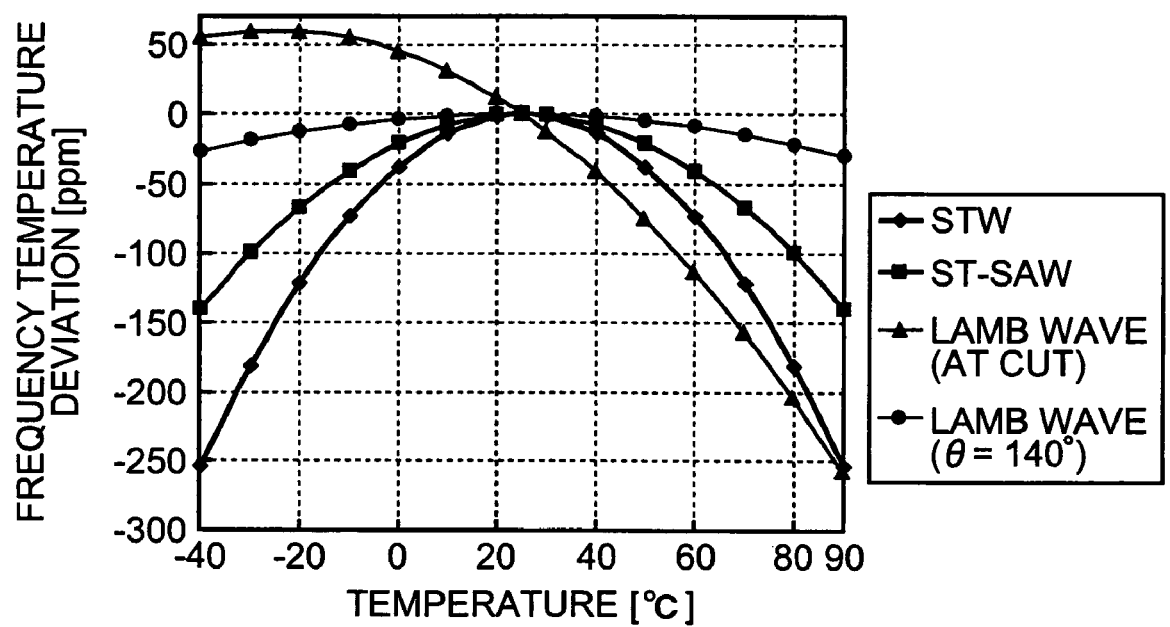
FIG. 6 is a graph showing the relationship between temperature and frequency temperature deviation according to the embodiment.
Figure 7:
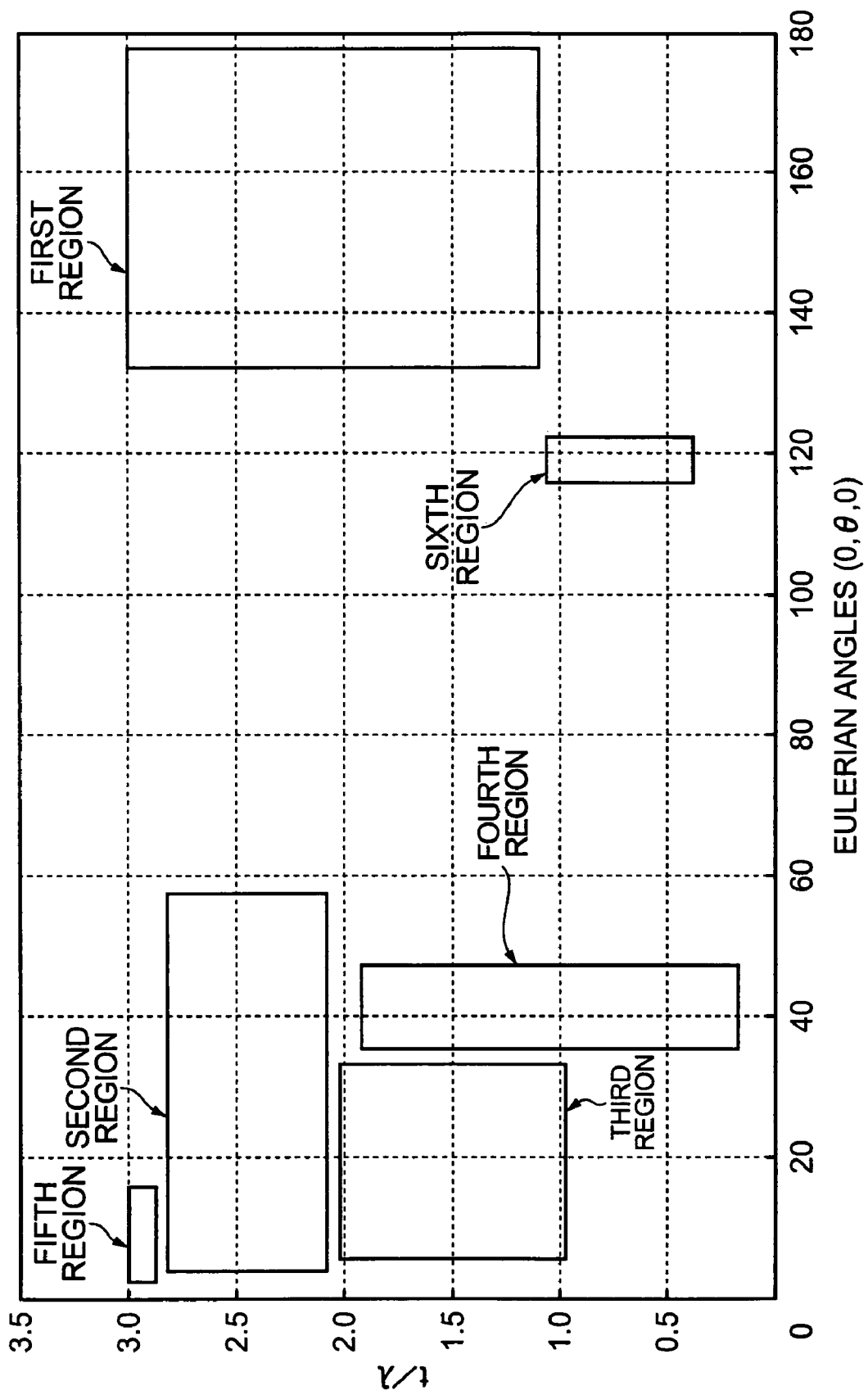
FIG. 7 is an explanatory diagram showing regions that can be provided by the Lamb-wave high-frequency resonator according to the embodiment.
Figure 12:
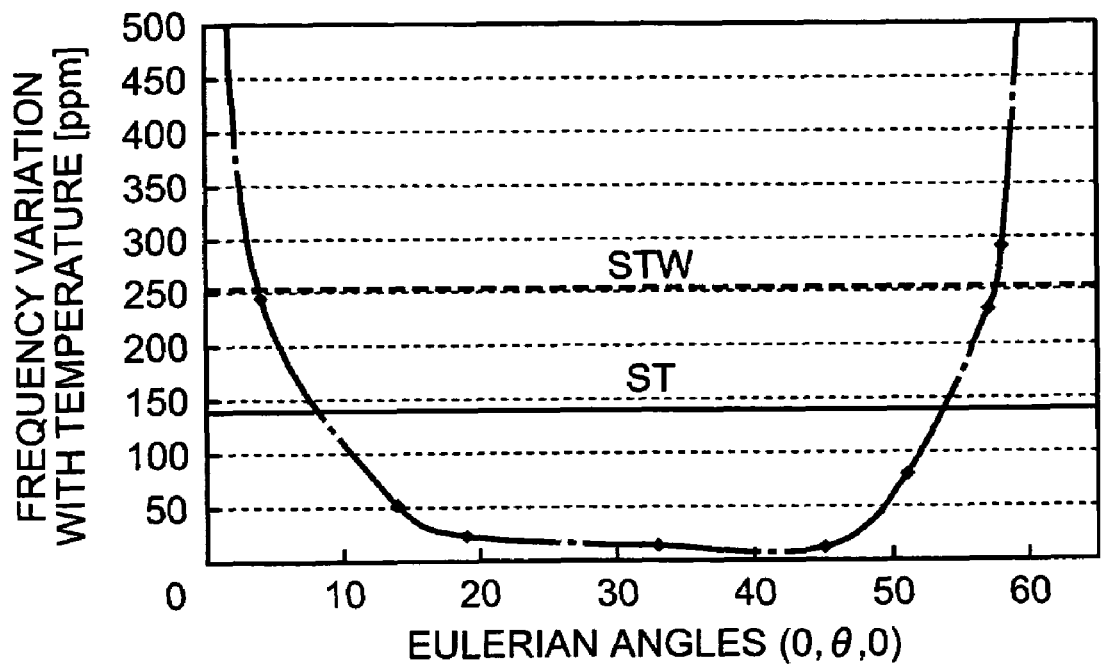
FIG. 12 is a graph showing the relationship between Euler angles and the frequency variation with temperature in a second region according to the embodiment.
Figure 13:
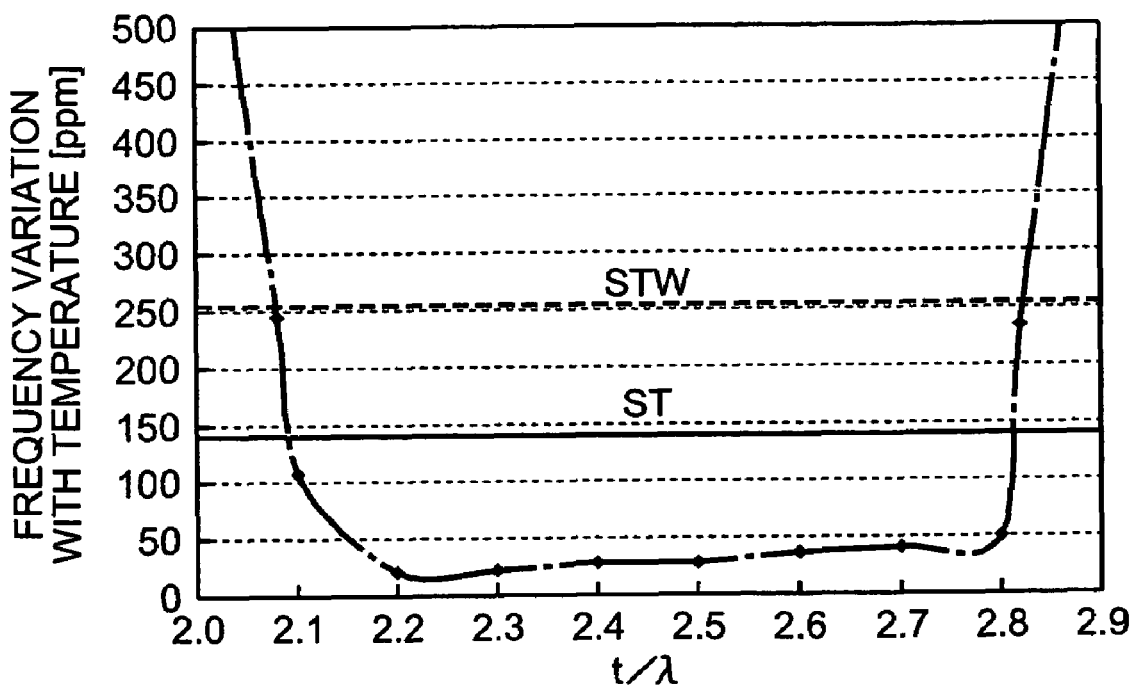
FIG. 13 is a graph showing the relationship between t/$\lambda$ and the frequency variation with temperature in the second region according to the embodiment.
Figure 14:
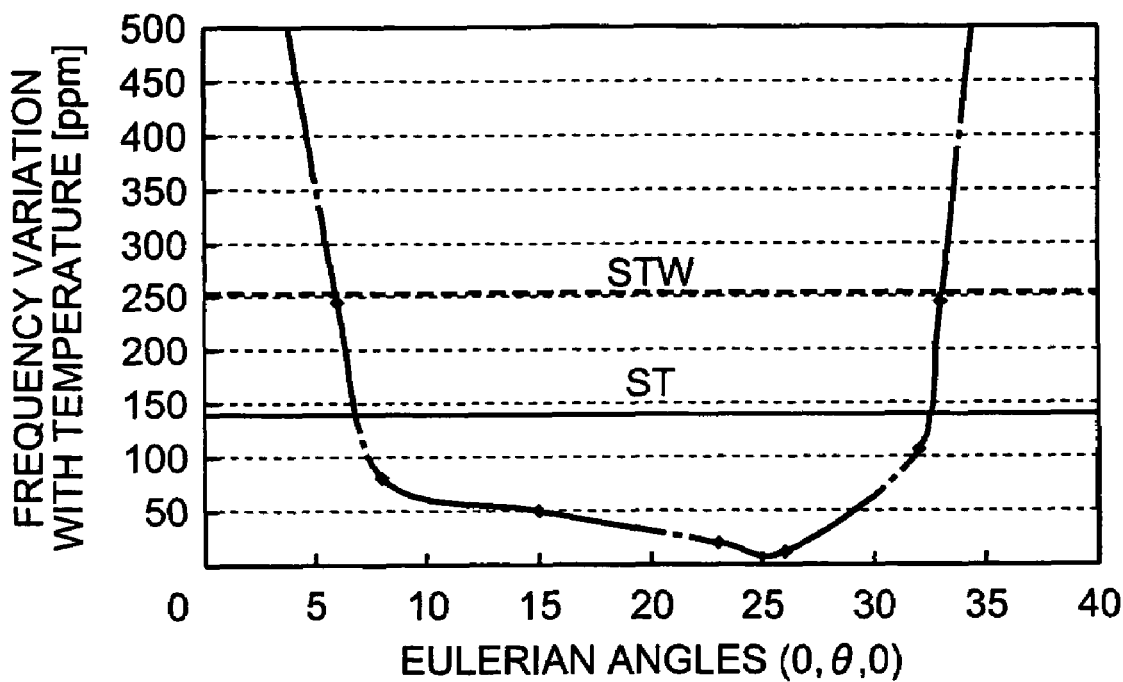
FIG. 14 is a graph showing the relationship between Euler angles and the frequency variation with temperature in a third region according to the embodiment.
Figure 15:
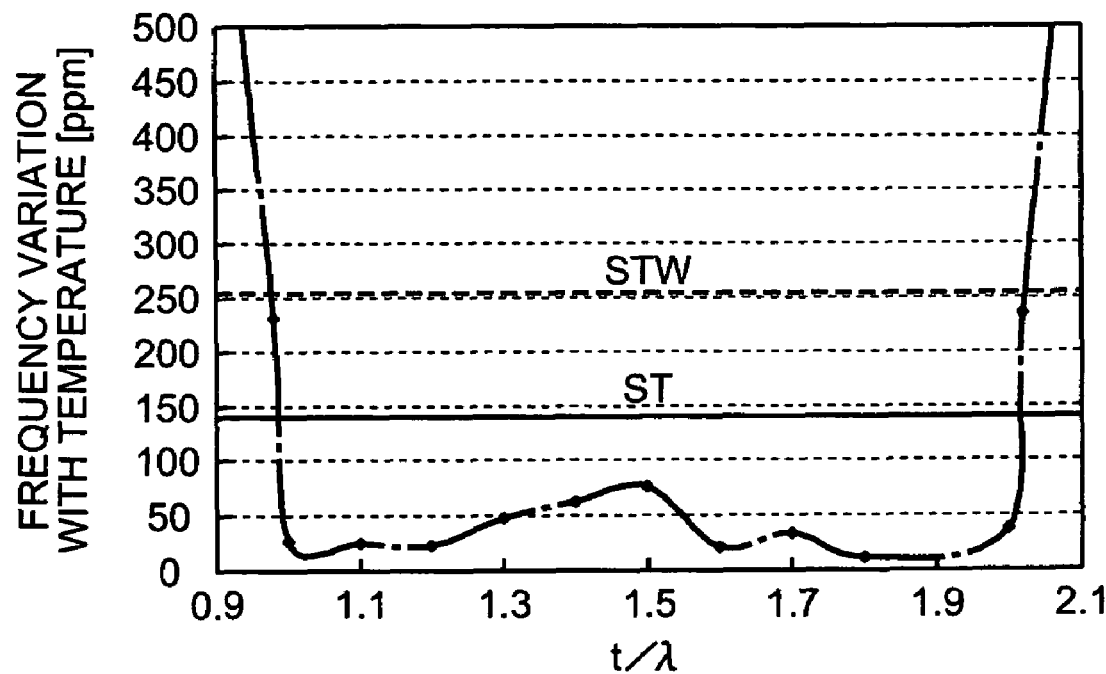
FIG. 15 is a graph showing the relationship between t/$\lambda$ and the frequency variation with temperature in the third region according to the embodiment.
Figure 24:
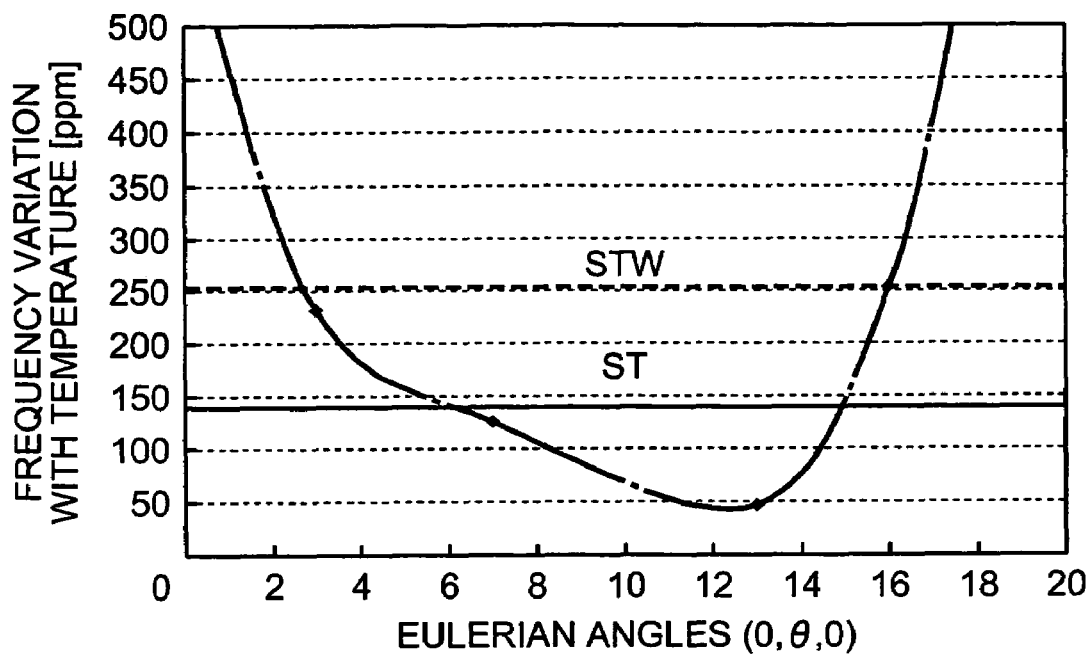
FIG. 24 is a graph showing the relationship between Euler angles and the frequency variation with temperature in a fifth region according to the embodiment.
Figure 25:
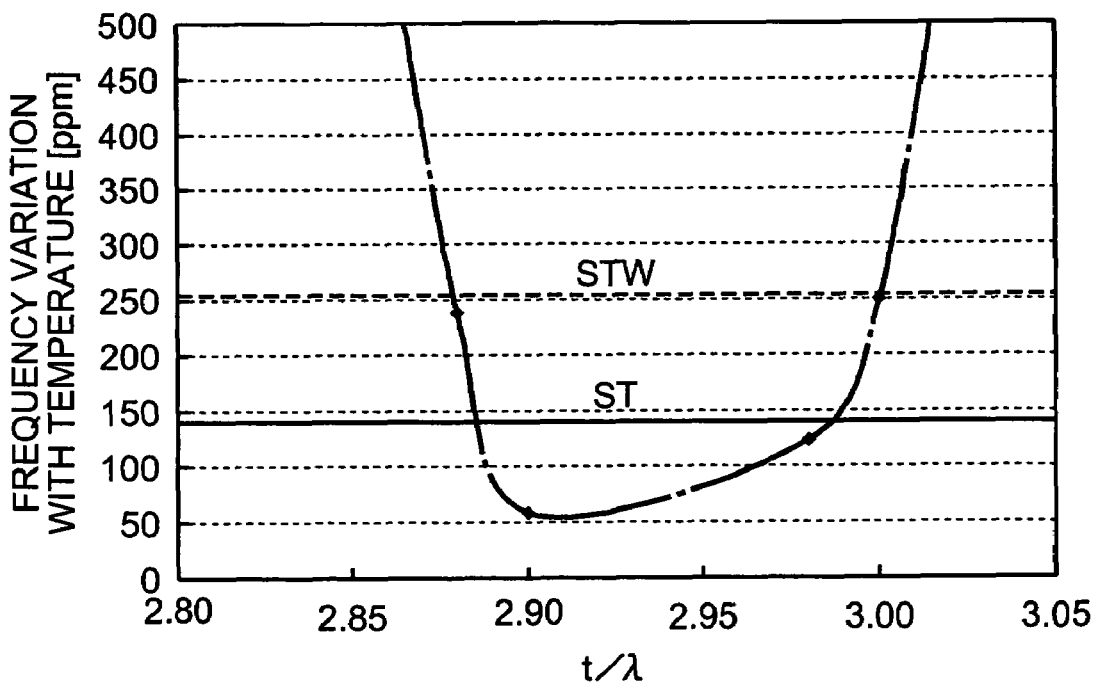
FIG. 25 is a graph showing the relationship between t/$\lambda$ and the frequency variation with temperature in the fifth region according to the embodiment.

An embodiment of the invention will be described with reference to the drawings. FIGS. 1 to 3 show a Lamb-wave high-frequency resonator according to an embodiment of the invention. FIG. 4 is a graph showing the relationship between phase velocity and standardized substrate thickness t/$\lambda$; FIG. 5 is a graph showing the relationship among phase velocity, standardized substrate thickness $t/\lambda$ and angle $\theta$ of Euler angles (0, $\theta$, 0); FIG. 6 is a graph showing the relationship between frequency temperature deviation and temperature; and FIG. 7 is an explanatory diagram of regions that can be provided by the Lamb-wave high-frequency resonator of the invention. FIGS. 8 to 11 show graphs of the characteristics of a first region; FIGS. 12 and 13 show graphs of the characteristics of a second region; FIGS. 14 and 15 show graphs of the characteristics of a third region; FIGS. 16 to 23 show graphs of the characteristics of a fourth region; FIGS. 24 and 25 show graphs of the characteristics of a fifth region; and FIGS. 26 to 33 show graphs of the characteristics of a sixth region.

FIGS. 1 and 2 show a Lamb-wave high-frequency resonator 1 according to an embodiment of the invention, wherein FIG. 1 is a schematic perspective view of the structure, and FIG. 2 is a cross-sectional view taken along line A-A of FIG. 1. In FIGS. 1 and 2, the Lamb-wave high-frequency resonator 1 includes a quartz substrate 10 and a comb-shaped IDT electrode 20 formed on one main surface of the quartz substrate 10.

The quartz substrate 10 is set such that the cut angle of the surface and the direction of propagation of a Lamb wave fall within the region expressed by Euler angles (0, $\theta$, 0). The thickness $t$ of the quartz substrate 10 is set so that the standardized substrate thickness $t/\lambda$ falls within the range expressed as $0<t/\lambda\leq3$ where $\lambda$ is the wavelength of a propagated Lamb wave.

The comb-shaped IDT electrode 20 is made of aluminum, and is formed on the surface of the quartz substrate 10 in order of a reflector 25, an input IDT electrode 21, a ground (GND) IDT electrode 22, and a reflector 26 along the X-axis of the quartz substrate 10.

The input IDT electrode 21 and the GND IDT electrode 22 are formed such that electrode pieces are interposed mutually, for example, the width of each electrode piece is $\lambda/4$ and the space between the electrode pieces is $\lambda/4$. In other words, the pitch between an electrode piece 21A and an electrode piece 21B is set in $\lambda$ with the input IDT electrode 21 as an example. Also the electrode pieces of the reflectors 25 and 26 are set in the same relationship.

The quartz substrate 10 is excited by a driving signal input to the input IDT electrode 21 at a specified frequency. The excited elastic wave propagates between the front and back surfaces of the quartz substrate 10 while being reflected along the X-axis of the quartz substrate 10. Such a propagated elastic wave is called a Lamb wave, which is reflected by the reflectors 25 and 26. Accordingly, the distance between the electrode piece on the outer end of the input IDT electrode 21 (on the left end in the drawing) and the reflector 25, and the distance between the electrode piece on the outer end of the input IDT electrode 21 (on the right end in the drawing) and the reflector 26 is are set to $(\frac{1}{2})n\lambda$ ($n$ is an integer) so that the reflected wave agrees in phase with the driving signal at a specified frequency.

FIG. 3 shows the cutting direction of the quartz substrate 10. The quartz substrate 10 is a thin plate constructed of a plane of the X-axis called an electrical axis, a plane of the Y-axis called a mechanical axis, and a plane of the Z-axis called an optical axis. The quartz substrate 10 of this embodiment is a rotated Y-cut quartz whose Z-axis along the thickness is rotated by angle $\theta$ to direction Z', and which is cut such that the longitudinal direction agrees with the X-axis, the width direction agrees with direction Y', and the thickness direction agrees with direction Z'.

The theoretical values of the principal parameters for the embodiment will be described with reference to the graphs of the relationship with related factors.

FIG. 4 is a graph showing part of the relationship between standardized substrate thickness $t/\lambda$ and phase velocity. In FIG. 4, the horizontal axis is scaled in terms of $t/\lambda$; the vertical axis is scaled in phase velocity (m/s). This illustrates a Lamb-wave high-frequency resonator with Euler angles (0, 140, 0). FIG. 4 shows that the Lamb-wave high-frequency resonator has multiple modes. The phase velocities in the modes are concentrated within the range of 3000 m/s to 6000 m/s as the standardized substrate thickness $t/\lambda$ increases, and in particular, they are densely concentrated within the range from 5000 m/s to 6000 m/s.

When the modes are densely concentrated like this, mode coupling tends to occur, thus not providing a desired mode, or the phase velocity may be varied. Thus, the range in which mode coupling occur easily can be avoided by setting to $t/\lambda\leq3$.

Referring to the graph, the phase velocity increases as $t/\lambda$ decreases, wherein there are multiple modes in which the phase velocity is more than 6000 m/s when $t/\lambda\leq3$. This indicates that the Lamb-wave high-frequency resonator can cope with high frequencies, because the phase velocity is expressed by the product of its frequency and wavelength.

The relationship between phase velocity and Euler angles (0, $\theta$, 0) will be described.

FIG. 5 shows a graph of the relationship among phase velocity, angle $\theta$, and standardized substrate thickness $t/\lambda$. FIG. 5 plots angle $\theta$ on the horizontal axis against phase velocity on the vertical axis. Here, the standardized substrate thickness $t/\lambda$ is set to seven values from 0.5 to 4, showing the respective theoretical values of the phase velocity at $t/\lambda$.

FIG. 5 shows the tendency that when the value of $t/\lambda$ is equal to or smaller than 0.8, the phase velocity increases as the angle $\theta$ increases, and when the value of $t/\lambda$ is equal to or larger than 1.2, the phase velocity decreases as the angle $\theta$ increases.

This indicates that phase velocities higher than 5000 m/s, which are supposed to be the limit of the STW-cut quartz, can be provided when Euler angles (0, $\theta$, 0) are within the range of angle $\theta$ shown in the graph in any standardized substrate thickness, and phase velocities higher than 7000 m/s, which are supposed to be high-frequency ranges, can be provided when $t/\lambda$ is equal to or smaller than 0.8.

The frequency temperature characteristic of the Lamb-wave high-frequency resonator according to the embodiment will be described with reference to the drawings.

FIG. 6 is a graph showing the relationship between temperature and resonance frequency. FIG. 6 plots temperature (in ° C.) on the horizontal axis and frequency temperature deviation (in ppm) when the frequency at a temperature of 25° C. is the central frequency. This compares the frequency temperature deviations of the Lamb-wave high-frequency resonator with $\theta=140$ according to the embodiment, the above-described related-art Rayleigh-wave surface acoustic wave devices constructed of an ST-cut quartz (hereinafter, simply referred to as ST type), and SH-wave surface acoustic wave device constructed of an STW-cut quartz (hereinafter, simply referred to as STW type), and a Lamb-wave high-frequency resonator constructed of an AT-cut quartz (hereinafter, simply referred to as AT type) within the range from −40° C. to 90° C.

FIG. 6 shows that the frequency variation with temperature of the Lamb-wave high-frequency resonator of the embodiment (Lamb wave with $\theta=140°$ in the graph) is the lowest 30 ppm in the temperature range from −40° C. to 90° C., having a preferable frequency temperature characteristic. With the ST type, the STW type, and the lamb-wave high-frequency resonator 1 according to the embodiment, the position of the quadratic curve indicating variations in frequency temperature deviation at which the frequency is the highest (peak temperature) is about 20° C. that is the standard temperature in actual use environment; with the AT type (Lamb wave (AT-cut) in the graph), it is about −25° C., resulting in a prediction that it is difficult to use also because of its high frequency temperature variation.

The frequency temperature deviation and the phase velocity (frequency band) of the lamb-wave high-frequency resonator 1 of this embodiment are determined from the angle θ of Euler angles (0, θ, 0) of the cut angle of the quartz substrate, substrate thickness t, and wavelength λ. Here will be shown theoretically calculated regions that provide a phase velocity and frequency temperature characteristics to be achieved by the invention.

FIG. 7 shows an explanatory diagram of the regions that can be achieved by the Lamb-wave high-frequency resonator of the invention. The horizontal axis is scaled in terms of Euler angles; the vertical axis is scaled in t/λ. FIG. 7 shows, as characteristics to be achieved by the invention, multiple regions (first to sixth regions) in which a phase velocity of 5000 m/s, a frequency variation with temperature of 250 ppm or less, which is smaller than that of STW-cut quartz, within the range from −40° C. to 90° C., and an electromechanical coupling factor ($K^2$) of 0.02% or more, which is indicative of the efficient of excitation of a quartz substrate are provided.

Different regions are present in the range in which the Euler angles (0, θ, 0) or the value of t/λ are close to one another; for example, a second region, a third region, a fourth region, and a fifth region in FIG. 7. At the boundaries of the regions, vibration-mode coupling may occur easily. The second to fifth regions are present independently. Each of the regions will be described with reference to the drawings.

Figure 8:
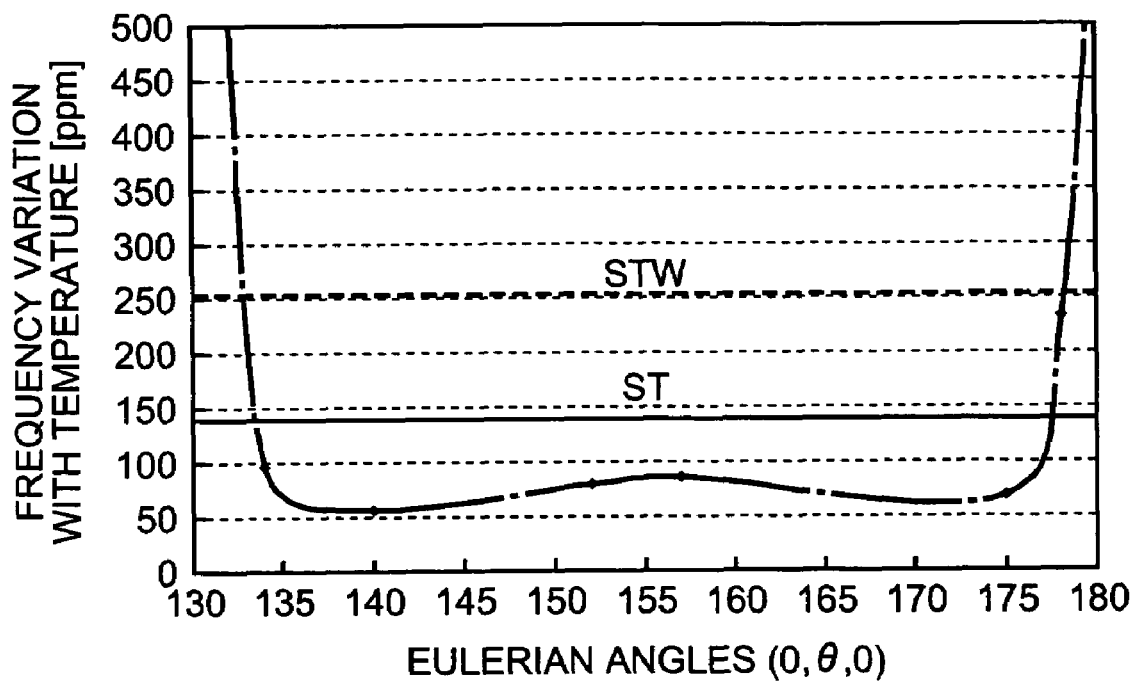
FIG. 8 is a graph showing the relationship between Euler angles and the frequency variation with temperature in a first region according to the embodiment.

FIG. 8 is a graph showing the relationship between the frequency variation with temperature of the lamb-wave high-frequency resonator 1 and angle θ of Euler angles (0, θ, 0) in the first region. The graph shows the case of the embodiment in which t/λ=2.2. FIG. 8 plots angle θ on the horizontal axis against frequency variation with temperature on the vertical axis. The graph shows the frequency variations with temperature of ST type and STW type for comparison. The frequency variation with temperature of the ST type is about 140 ppm, and that of the STW type is about 254 ppm, both of which are not on a satisfactory level.

The frequency variation with temperature in the first region varies depending on the angle θ. The frequency variation with temperature has only to be set within $132.8 \leq \theta \leq 178$ degrees to make it smaller than that of the STW type; it has only to be set within $133.5 \leq \theta \leq 177.5$ degrees to make it smaller than that of the ST type.

The relationship between the frequency variation with temperature and the thickness of a quartz substrate in the range from −40° C. to 90° C. will be described. The thickness of the quartz substrate is expressed as standardized substrate thickness t/λ to be defined by the relationship with the Lamb-wave frequency, as described above.

Figure 9:
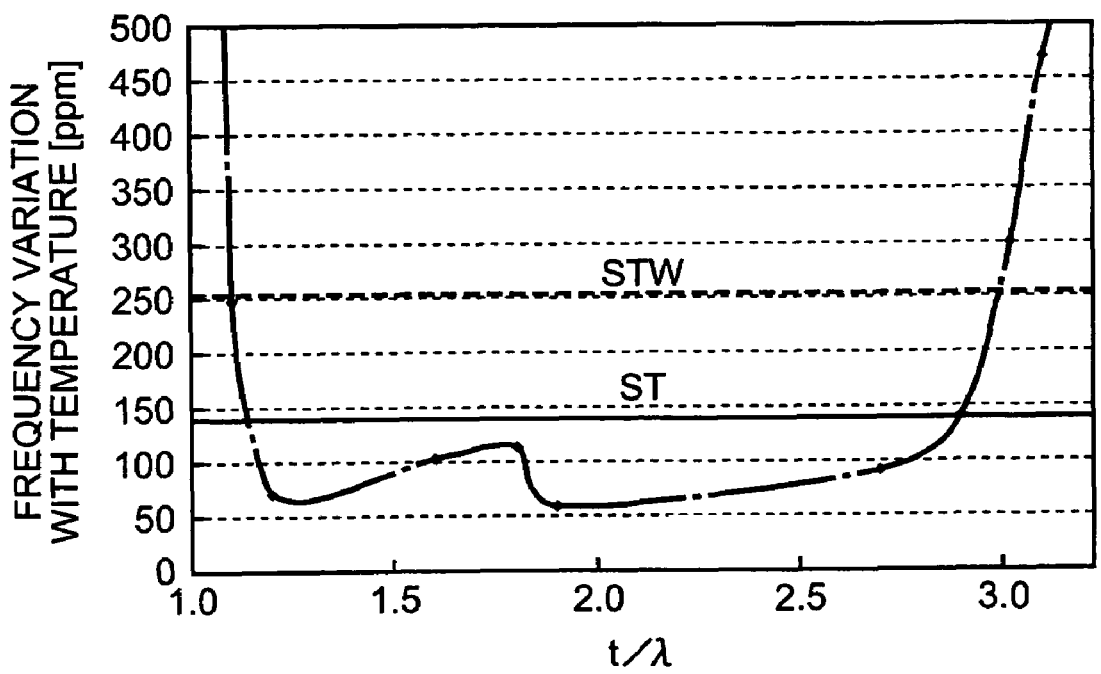
FIG. 9 is a graph showing the relationship between t/$\lambda$ and the frequency variation with temperature in the first region according to the embodiment.

FIG. 9 is a graph showing the relationship between the frequency variation with temperature and the standardized substrate thickness t/λ (hereinafter, sometimes simply referred to as t/λ) of the Lamb-wave high-frequency resonator in the first region. The graph shows the embodiment in the case of angle θ=140 degrees. FIG. 9 plots t/λ on the horizontal axis against the frequency variation with temperature on the vertical axis.

The frequency variation with temperature varies depending on the value of t/λ. The frequency variation with temperature in the first region has only to be set within $1.1 \leq t/\lambda \leq 3$ to make it smaller than that of the STW type; it has only to be set within $1.1 \leq t/\lambda \leq 2.9$ to make it smaller than that of the ST type.

The relationship among the electromechanical coupling factor $K^2$, angle θ, and t/λ of the Lamb-wave high-frequency resonator according to the embodiment will be described.

Figure 10:
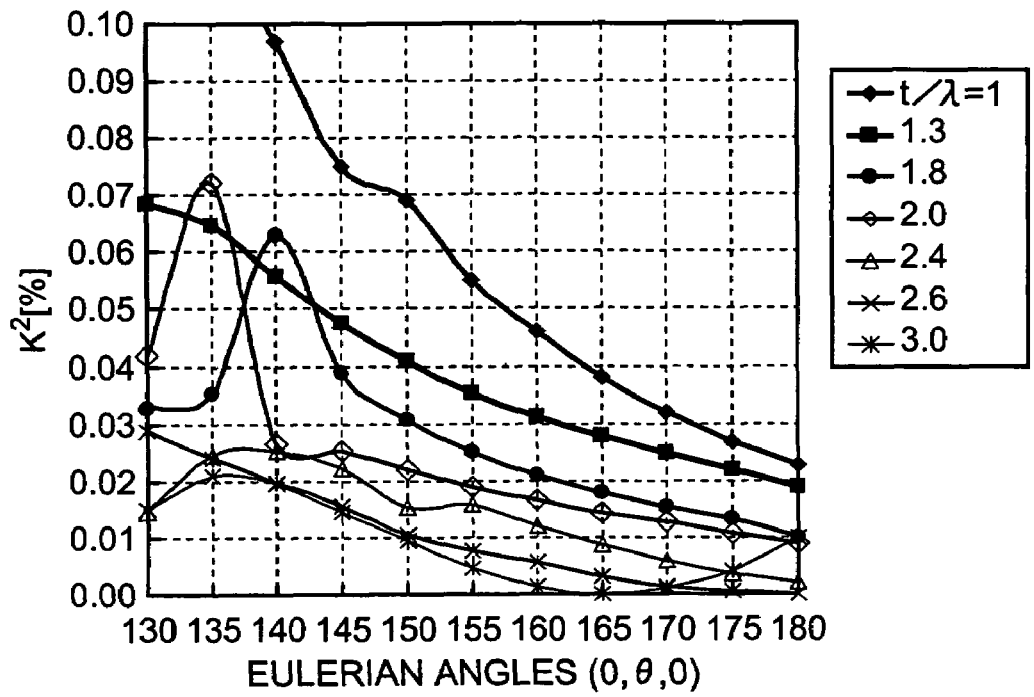
FIG. 10 is a graph showing the relationship between Euler angles and the electromechanical coupling factor $K^2$ in the first region according to the embodiment.

FIG. 10 is a graph showing the relationship between the electromechanical coupling factor $K^2$ and angle θ of Euler angles (0, θ, 0). FIG. 10 plots Euler angles (0, θ, 0) on the horizontal axis against the electromechanical coupling factor $K^2$ (in %) on the vertical axis. Here, the standardized substrate thickness t/λ is set to seven values in the range from 1 to 3, showing the respective theoretical values of the electromechanical coupling factor $K^2$ at the thicknesses.

The electromechanical coupling factor $K^2$ is expressed as $K^2=2(Vf-Vs)/Vf$ where Vf is the phase velocity when the surface of the quartz substrate is electrically released and Vs is the phase velocity when the surface of the quartz substrate is electrically short-circuited. It is known that excitation occurs easily as the value of $K^2$ increases.

FIG. 10 shows that the electromechanical coupling factor $K^2$ increases as the thickness t of the quartz substrate decreases, and that the electromechanical coupling factor $K^2$ increases as the angle θ decreases. There is a point where an angle θ at which the electromechanical coupling factor $K^2$ exceeds 0.02% is provided at each t/λ with the angle θ within the range from 130 to 180 degrees with reference to the relationship between the angle θ and the frequency variation with temperature (refer to FIG. 8), as described above. The Lamb-wave high-frequency resonator according to the embodiment can provide a sufficient exciting characteristic when the electromechanical coupling factor $K^2$ is 0.02% or more.

The relationship between the electromechanical coupling factor $K^2$ and the standardized substrate thickness t/λ of the Lamb-wave high-frequency resonator according to the embodiment will be described.

Figure 11:
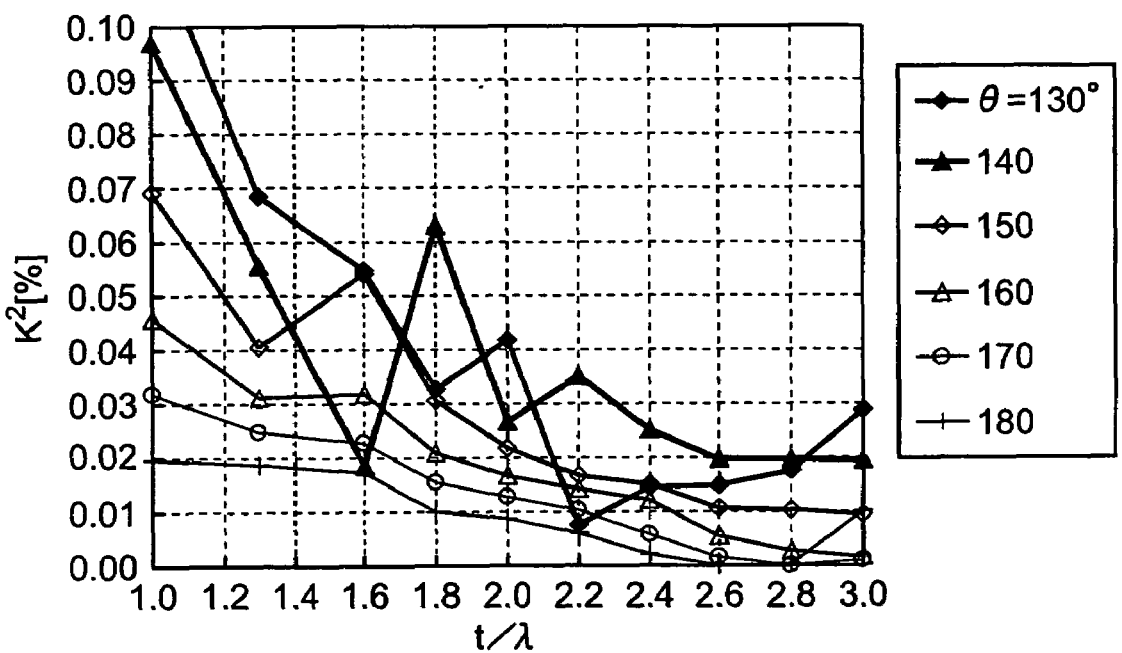
FIG. 11 is a graph showing the relationship between t/$\lambda$ and the electromechanical coupling factor $K^2$ in the first region according to the embodiment.

FIG. 11 is a graph showing the relationship between the electromechanical coupling factor $K^2$ and the standardized substrate thickness t/λ. FIG. 11 plots t/λ on the horizontal axis against the electromechanical coupling factor $K^2$ (in %) on the vertical axis. Here, the angle θ is set to six values from 130 to 180 degrees, which is divided every 10 degrees, showing the respective theoretical values of the electromechanical coupling factor $K^2$ of the angles θ.

FIG. 11 shows the tendency that the electromechanical coupling factor $K^2$ increases as the angle θ decreases, and the tendency that the electromechanical coupling factor $K^2$ increases as t/λ decreases. This shows that there is a point at which the electromechanical coupling factor $K^2$ exceeds 0.02 with the angle θ within the range from 130 to 180 degrees in the range of $1.1 \leq t/\lambda \leq 3$ in which the frequency variation with temperature is substantially more preferable than that of the STW type, with reference to the relationship between t/λ and the frequency variation with temperature (refer to FIG. 9), described above.

The second region will be described.

FIG. 12 is a graph showing the relationship between the frequency variation with temperature and angle θ in Euler angles (0, θ, 0) in the second region; and FIG. 13 is a graph showing the relationship between the frequency variation with temperature and t/λ in the second region. Here the range of θ in Euler angles (0, θ, 0) and the range of t/λ in which the frequency temperature characteristic is higher (the frequency variation with temperature is smaller) than that of the STW-cut quartz are $4 \leq \theta \leq 57.5$ degrees and $2.08 \leq t/\lambda \leq 2.82$, respectively.

The third region will next be described.

FIG. 14 is a graph showing the relationship between the frequency variation with temperature and angle $\theta$ in Euler angles (0, $\theta$, 0) in the third region; and FIG. 15 is a graph showing the relationship between the frequency variation with temperature and $t/\lambda$ in the third region. Here the range of $\theta$ in Euler angles (0, $\theta$, 0) and the range of $t/\lambda$ in which the frequency temperature characteristic is higher than that of the STW-cut quartz are $6 \leq \theta \leq 33$ degrees and $0.975 \leq t/\lambda \leq 2.025$, respectively.

Although the illustration and the detailed description are omitted here, there is also a point at which the phase velocity exceeds 5000 m/s and the electromechanical coupling factor $K^2$ exceeds 0.02 in the range of Eulerian angle and $t/\lambda$ in the second and third regions.

Referring to FIGS. 16 to 23, the fourth region will be described.

Figure 16:
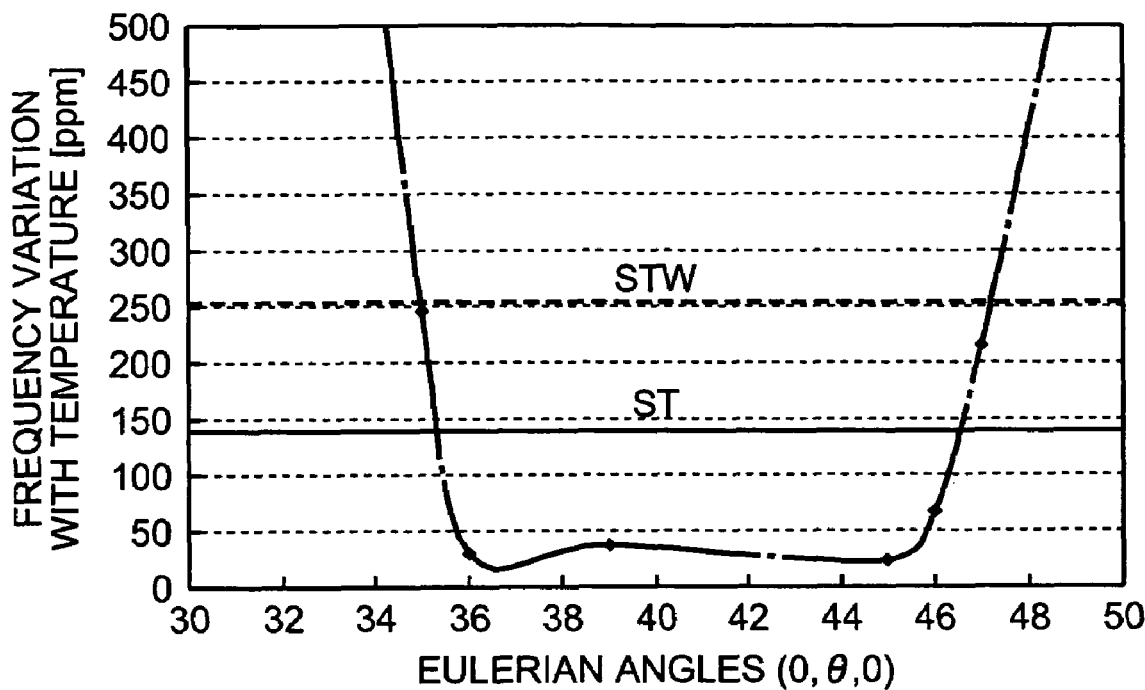
FIG. 16 is a graph showing the relationship between Euler angles and the frequency variation with temperature in a fourth region according to the embodiment.
Figure 17:
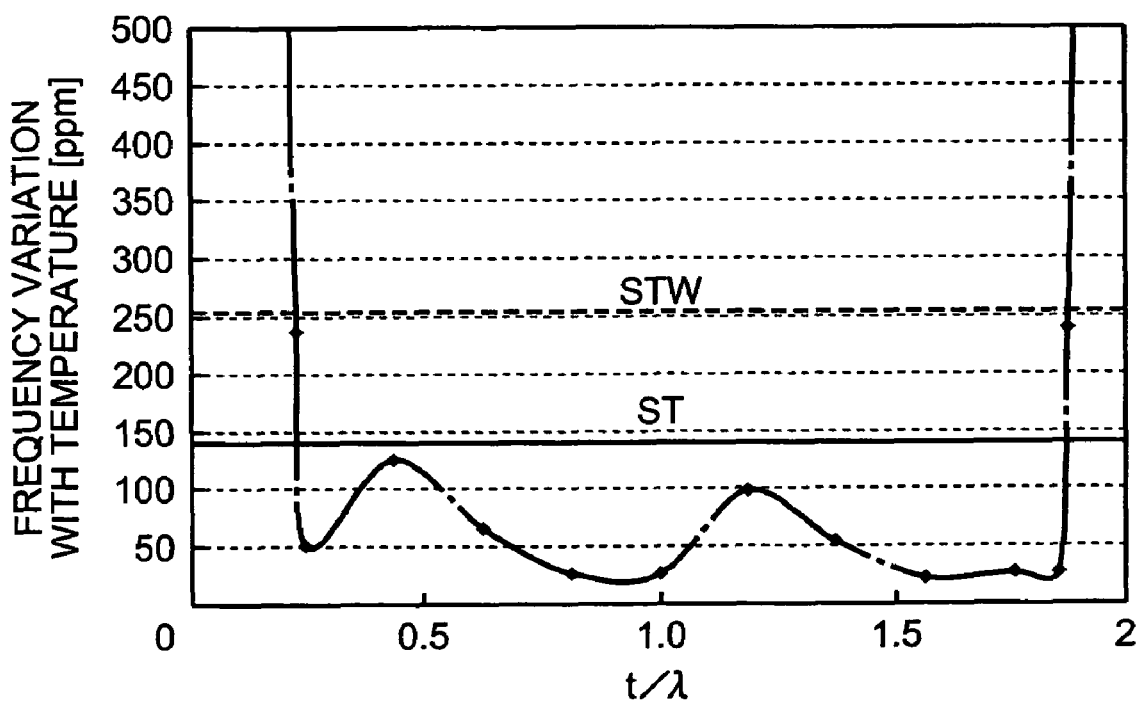
FIG. 17 is a graph showing the relationship between t/$\lambda$ and the frequency variation with temperature in the fourth region according to the embodiment.

FIG. 16 is a graph showing the relationship between the frequency variation with temperature and angle $\theta$ in Euler angles (0, $\theta$, 0) in the fourth region; and FIG. 17 is a graph showing the relationship between the frequency variation with temperature and $t/\lambda$ in the fourth region. Here the range of angle $\theta$ in Euler angles (0, $\theta$, 0) and the range of $t/\lambda$ in which the frequency temperature characteristic is higher than that of the STW-cut quartz are $35 \leq \theta \leq 47.2$ degrees and $0.176 \leq t/\lambda \leq 1.925$, respectively.

The relationship among the angle $\theta$, $t/\lambda$, the phase velocity, the frequency variation with temperature, and the electromechanical coupling factor $K^2$ in the fourth region will be described in detail.

Figure 18:
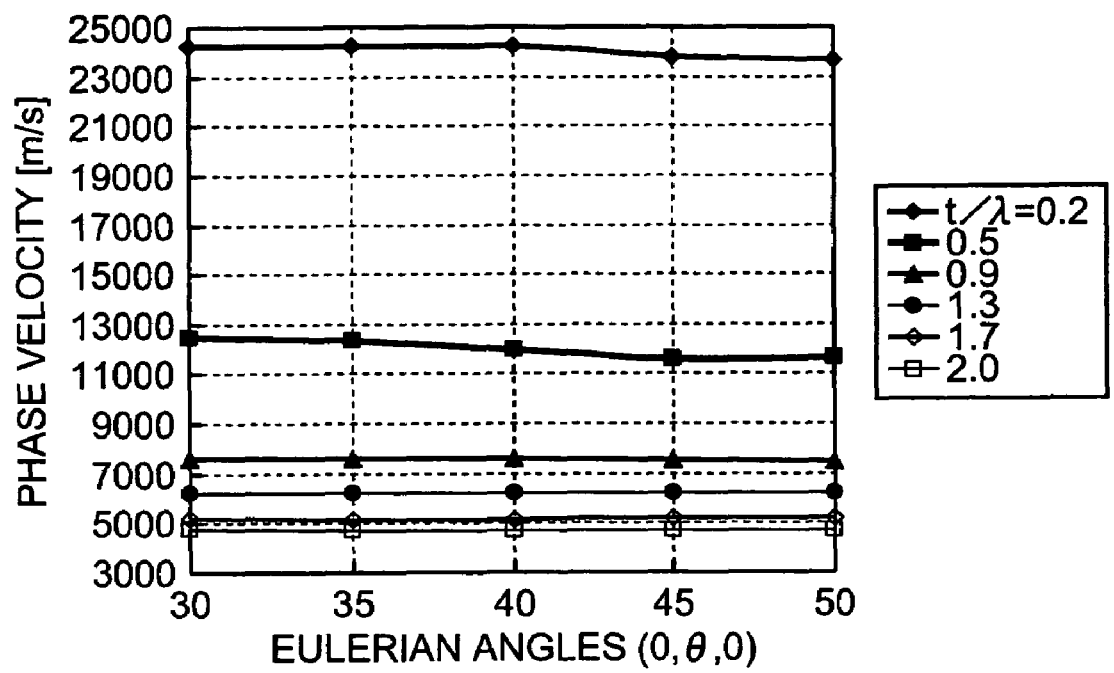
FIG. 18 is a graph showing the relationship between Euler angles and the phase velocity in the fourth region according to the embodiment.

FIG. 18 shows the relationship between angle $\theta$ in Euler angles (0, $\theta$, 0) and the phase velocity. Here $t/\lambda$ is set on a scale of six from 0.2 to 2.0, and the phase velocity at each $t/\lambda$ is shown in the graph. FIG. 18 shows that phase velocities exceeding 5000 m/s are obtained at the values of $t/\lambda$ with the angle $\theta$ in the range from 30 to 50 degrees, except the case of $t/\lambda=2.0$.

Figure 19:
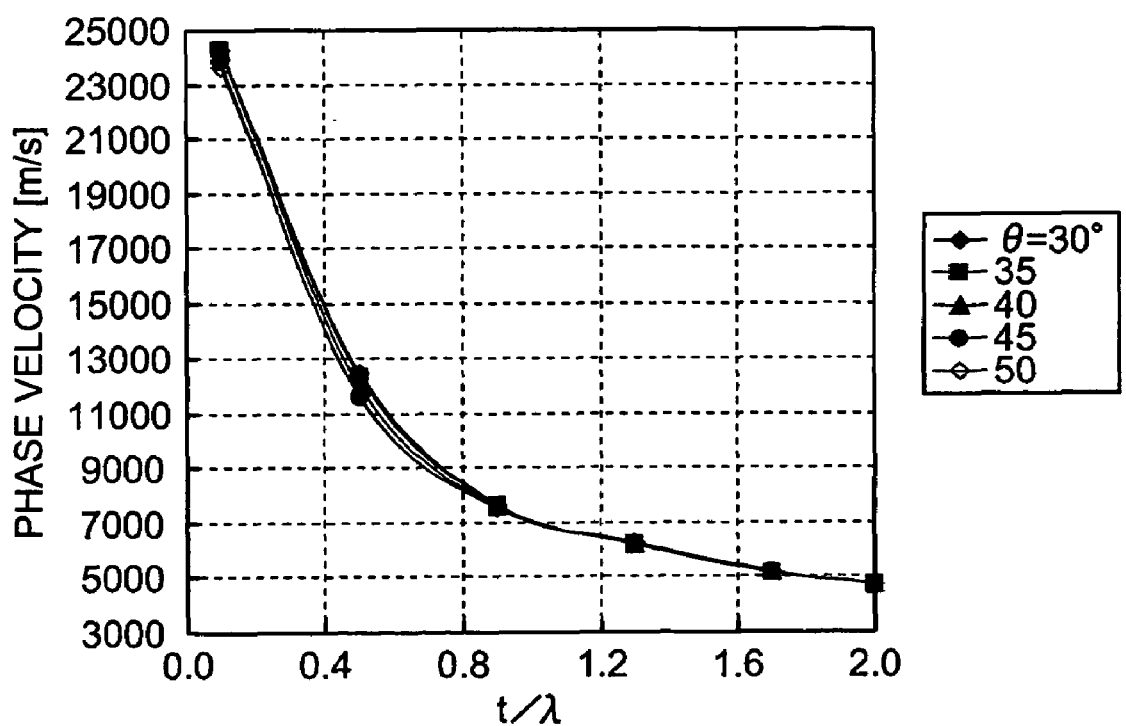
FIG. 19 is a graph showing the relationship between t/$\lambda$ and the phase velocity in the fourth region according to the embodiment.

FIG. 19 is a graph of the relationship between $t/\lambda$ and phase velocity, showing the phase velocities at angle $\theta$ of Euler angles (0, $\theta$, 0), the angle $\theta$ being set in five levels from 30 to 50 degrees. FIG. 19 shows that the variation of the phase velocity at the angle $\theta$ is small, and that phase velocities exceeding 5000 m/s can be provided in most of the range from 0.2 to 2.

The relationship among Euler angles, $t/\lambda$, phase velocity, frequency variation with temperature, and electromechanical coupling factor $K^2$ will be described.

Figure 20:
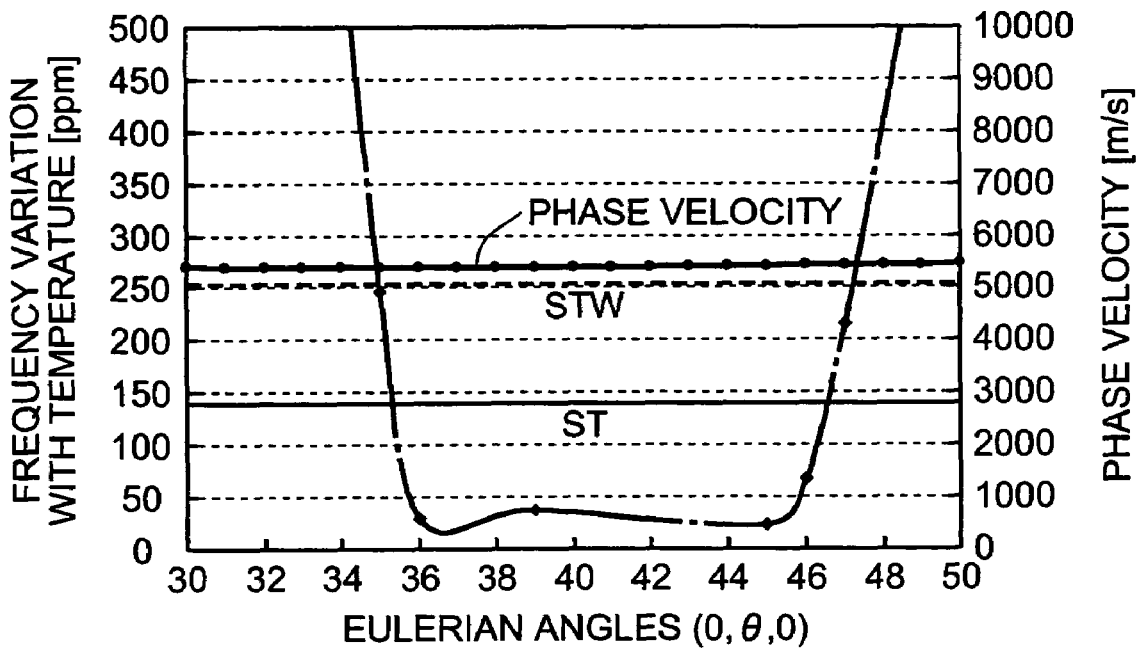
FIG. 20 is a graph showing the relationship among a Euler angles, the phase velocity, and the frequency variation with temperature in the fourth region according to the embodiment.

FIG. 20 shows the relationship among angle $\theta$ of Euler angles (0, $\theta$, 0), the phase velocity, and the frequency variation with temperature, where $t/\lambda$ is set at 1.7. FIG. 20 shows that the range of $\theta$ in which frequency variation with temperature is smaller than that of STW-cut quartz is $35 \leq \theta \leq 47.2$ degrees (also refer to FIG. 16), in which a phase velocity of 5000 m/s or more is provided.

Figure 21:
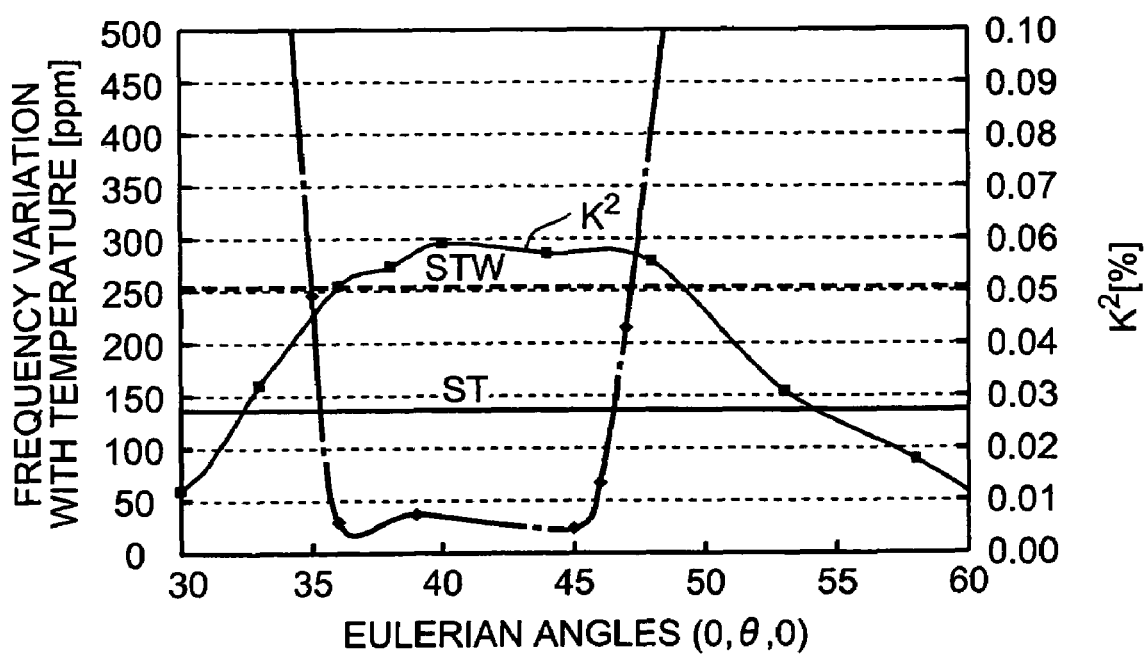
FIG. 21 is a graph showing the relationship among Eulerian angle, the electromechanical coupling factor $K^2$, and the frequency variation with temperature in the fourth region according to the embodiment.

FIG. 21 shows the relationship among Euler angles, the electromechanical coupling factor $K^2$, and the frequency variation with temperature. FIG. 21 shows that the range of angle $\theta$ of Euler angles (0, $\theta$, 0) in which frequency variation with temperature is smaller than that of STW-cut quartz is $35 \leq \theta \leq 47.2$ degrees (also refer to FIG. 16), in which electromechanical coupling factor $K^2$ far exceeds the reference value 0.02. When the range of angle $\theta$ is in $32.5 \leq \theta \leq 47.2$ degrees, the electromechanical coupling factor $K^2$ amounts to 0.03 or more; when the range of angle $\theta$ is in $34.2 \leq \theta \leq 47.2$ degrees, the electromechanical coupling factor $K^2$ amounts to 0.04 or more; and when the range of angle $\theta$ is $36 \leq \theta \leq 47.2$ degrees, the electromechanical coupling factor $K^2$ amounts to 0.05 or more.

Figure 22:
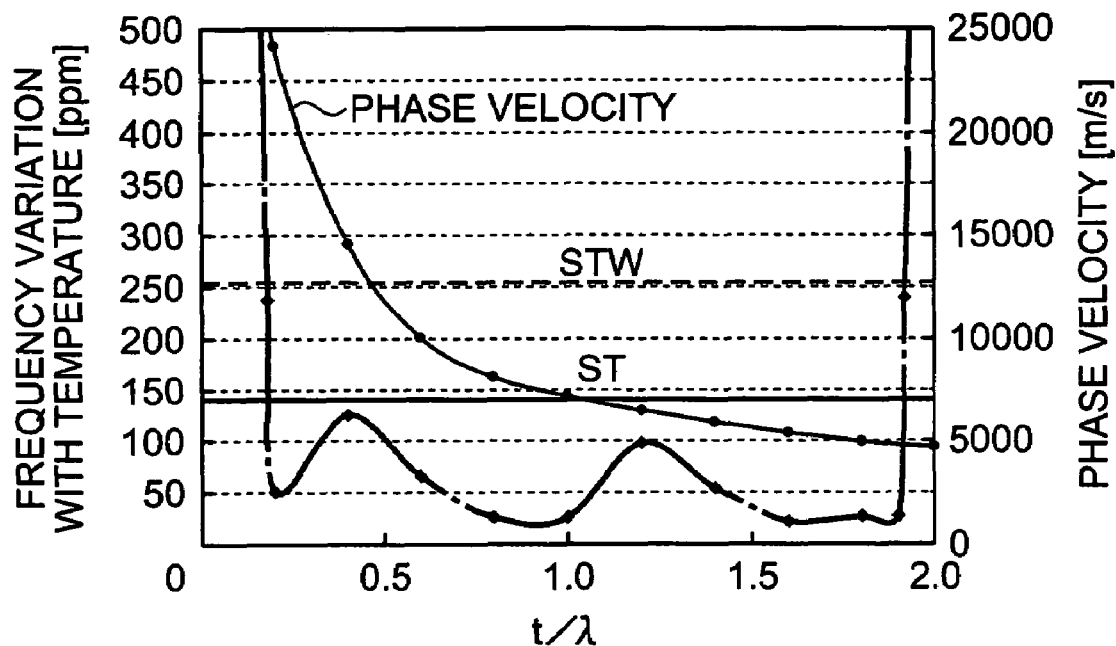
FIG. 22 is a graph showing the relationship among t/$\lambda$, the phase velocity, and the frequency variation with temperature in the fourth region according to the embodiment.

FIG. 22 shows the relationship among $t/\lambda$, the phase velocity, and the frequency variation with temperature. FIG. 22 shows that the range of $t/\lambda$ in which frequency variation with temperature is smaller than that of STW-cut quartz is $0.176 \leq \lambda \leq 1.925$ (also refer to FIG. 17), in most of which a phase velocity of 5000 m/s or more is provided. In the range of $t/\lambda$, the phase velocity increases as $t/\lambda$ decreases, providing a high-frequency band.

The relationship among $t/\lambda$, electromechanical coupling factor $K^2$, and frequency variation with temperature will next be shown.

Figure 23:
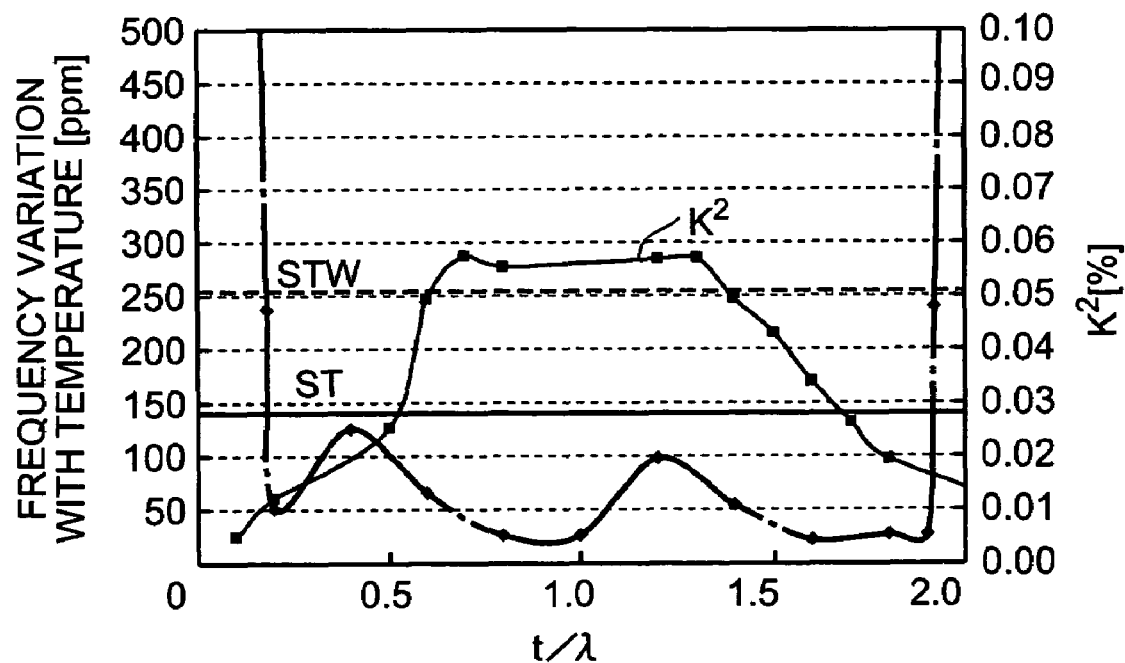
FIG. 23 is a graph showing the relationship among t/$\lambda$, the electromechanical coupling factor $K^2$, and the frequency variation with temperature in the fourth region according to the embodiment.

FIG. 23 shows the relationship among $t/\lambda$, the electromechanical coupling factor $K^2$, and the frequency variation with temperature. FIG. 23 shows that the range of $t/\lambda$ in which frequency variation with temperature is smaller than that of STW-cut quartz is $0.176 \leq t/\lambda \leq 1.925$ (also refer to FIGS. 17 and 22), in most of which an electromechanical coupling factor $K^2$ of 0.02 or more is provided. A region with a high electromechanical coupling factor $K^2$ exceeding 0.05 is provided in the range in which $t/\lambda$ is close to 1.

The fifth region will be described with reference to FIGS. 24 and 25.

FIG. 24 is a graph showing the relationship between the frequency variation with temperature and angle $\theta$ in Euler angles (0, $\theta$, 0) in the fifth region; and FIG. 25 is a graph showing the relationship between the frequency variation with temperature and $t/\lambda$ in the fifth region. In the fifth region, the range of angle $\theta$ and the range of $t/\lambda$ in which the frequency temperature characteristic is higher than that of the STW-cut quartz are $2.7 \leq \theta \leq 16$ degrees and $2.878 \leq t/\lambda \leq 3$, respectively.

The sixth region will be described with reference to FIGS. 26 to 33.

Figure 26:
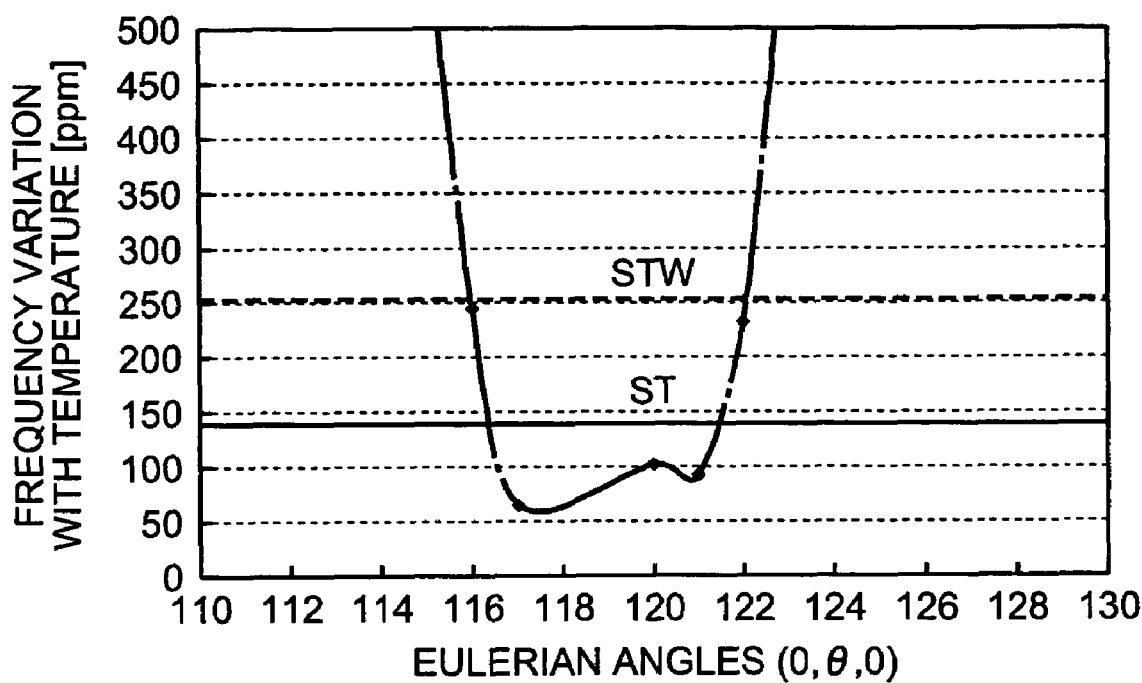
FIG. 26 is a graph showing the relationship between Euler angles and the frequency variation with temperature in a sixth region according to the embodiment.
Figure 27:
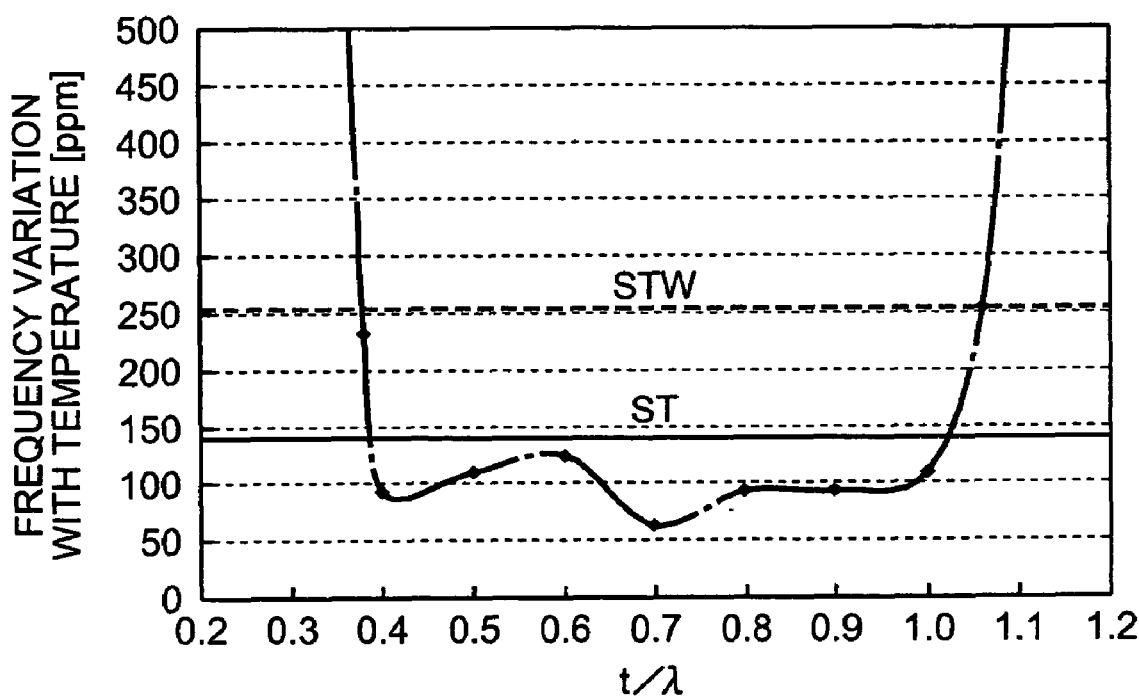
FIG. 27 is a graph showing the relationship between t/$\lambda$ and the frequency variation with temperature in the sixth region according to the embodiment.

FIG. 26 is a graph showing the relationship between the frequency variation with temperature and angle $\theta$ in Euler angles (0, $\theta$, 0) in the sixth region; and FIG. 27 is a graph showing the relationship between the frequency variation with temperature and $t/\lambda$ in the sixth region. In the sixth region, the range of angle $\theta$ and the range of $t/\lambda$ in which the frequency temperature characteristic is higher than that of the STW-cut quartz are $116 \leq \theta \leq 122.1$ degrees and $0.375 \leq t/\lambda \leq 1.06$, respectively.

The relationship among the angle $\theta$, $t/\lambda$, the phase velocity, the frequency variation with temperature, and the electromechanical coupling factor $K^2$ in the sixth region will be described in detail.

Figure 28:
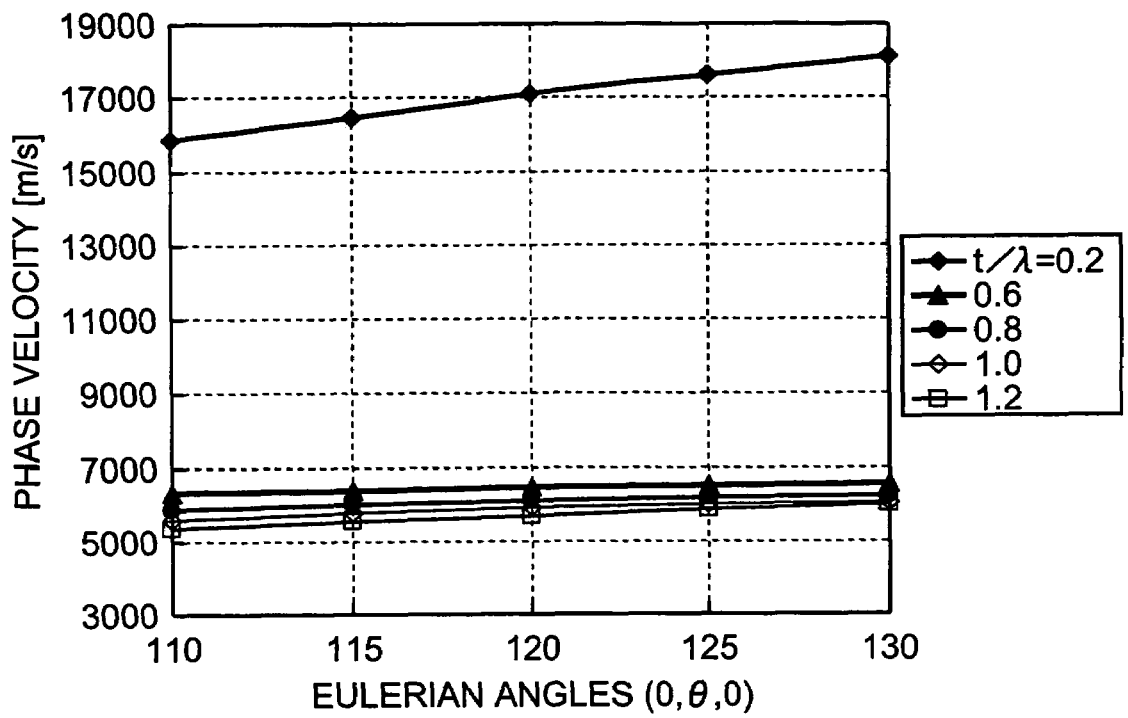
FIG. 28 is a graph showing the relationship among Euler angles, t/$\lambda$, and the phase velocity in the sixth region according to the embodiment.

FIG. 28 shows the relationship between angle $\theta$ in Euler angles (0, $\theta$, 0) and the phase velocity. Here $t/\lambda$ is set on a scale of five from 0.2 to 1,2, and the phase velocity at each $t/\lambda$ is shown in graph. FIG. 28 shows that phase velocities exceeding 5000 m/s are obtained at each $t/\lambda$ with the angle $\theta$ in the range from 110 to 130 degrees.

Figure 29:
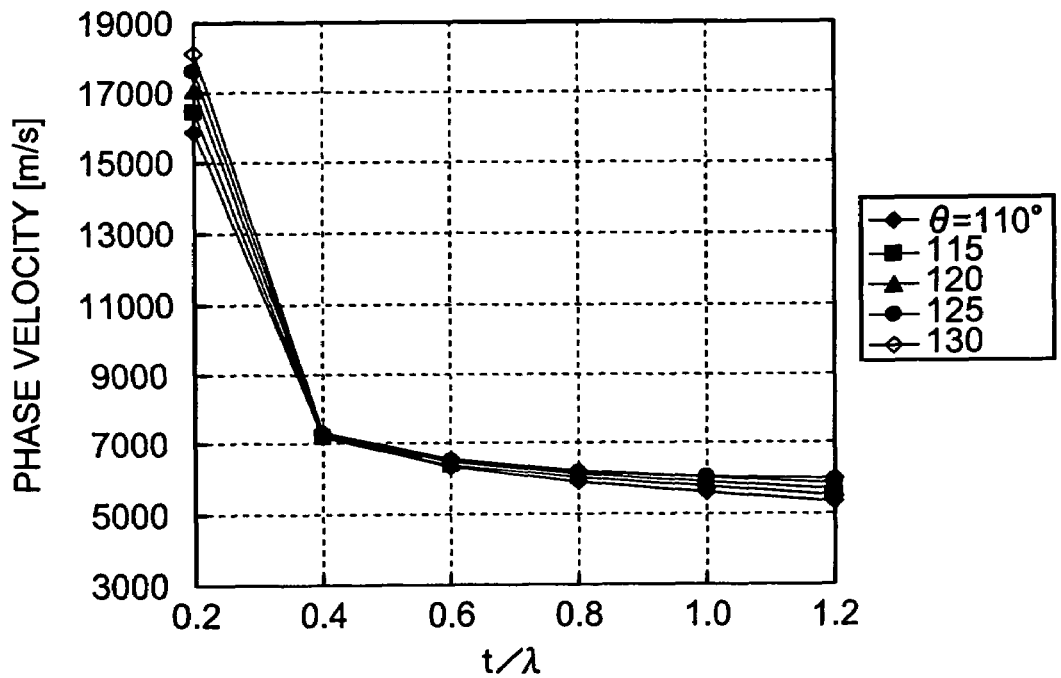
FIG. 29 shows the relationship among t/$\lambda$, Euler angles, and the phase velocity in the sixth region according to the embodiment.

FIG. 29 shows the relationship between $t/\lambda$ and the phase velocity. Here the angle $\theta$ of Euler angles is set on a scale of five from 110 to 130 degrees, and the phase velocity at each angle $\theta$ is shown in graph. FIG. 29 shows that the variation in the phase velocity at the angle $\theta$ is small, and that phase velocities exceeding 5000 m/s can be provided in the range in which $t/\lambda$ is from 0.2 to 1.2, and in particular, extremely high phase velocity can be provided in the range in which $t/\lambda$ is smaller than 0.4.

The relationship among Eulerian angle, t/λ, phase velocity, frequency variation with temperature, and electromechanical coupling factor $K^2$ will be described.

Figure 30:
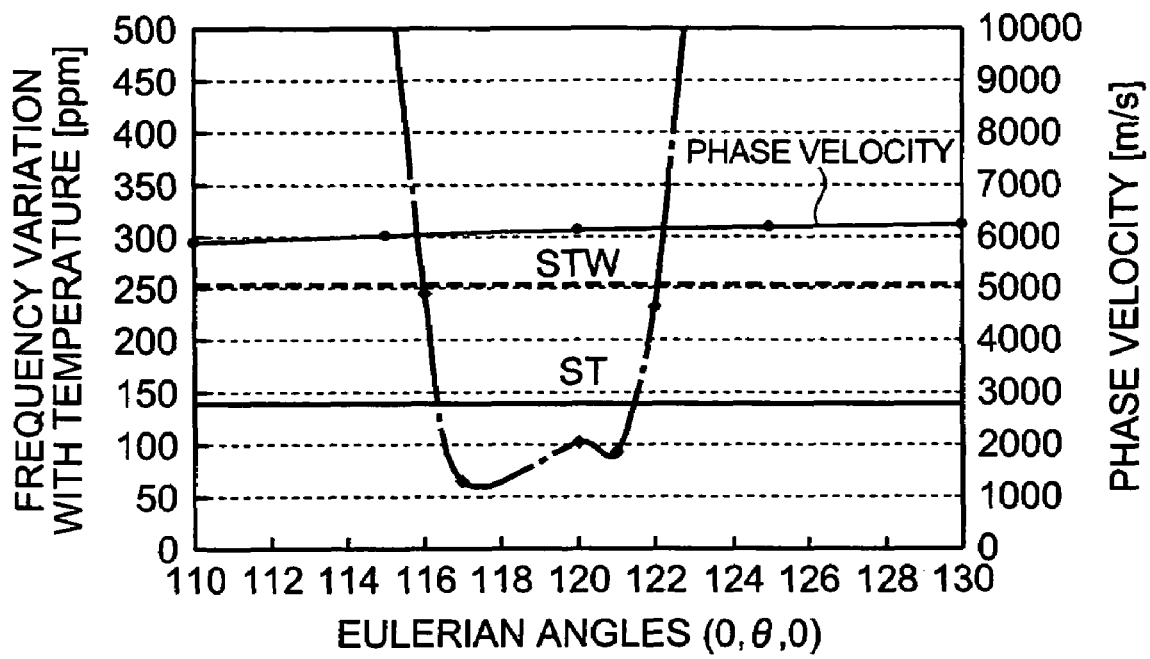
FIG. 30 is a graph showing the relationship among Euler angles, the phase velocity, and the frequency variation with temperature in the sixth region according to the embodiment.

FIG. 30 shows the relationship among angle θ of Euler angles (0, θ, 0), the phase velocity, and the frequency variation with temperature. FIG. 30 shows that the range of angle θ in which frequency variation with temperature is smaller than that of the STW-cut quartz is $116 \leq \theta \leq 122.1$ degrees (also refer to FIG. 26), in which a phase velocity of 5000 m/s or more is provided.

Figure 31:
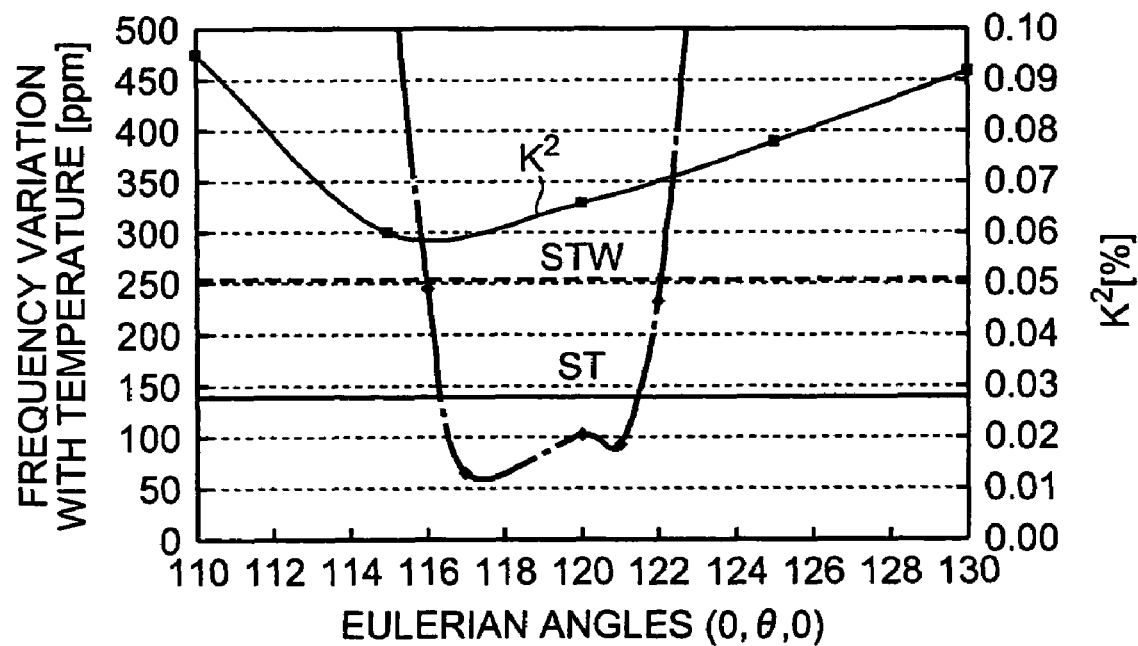
FIG. 31 is a graph showing the relationship among Euler angles, the electromechanical coupling factor $K^2$, and the frequency variation with temperature in the sixth region according to the embodiment.

FIG. 31 shows the relationship among Euler angles, the electromechanical coupling factor $K^2$, and the frequency variation with temperature. FIG. 31 shows that the range of angle θ of Euler angles (0, θ, 0) at which frequency variation with temperature is smaller than that of STW-cut quartz is $116 \leq \theta \leq 122.1$ degrees, in which electromechanical coupling factor $K^2$ amounts to 0.05 or more, which far exceeds a reference 0.02 and as such, it may easily be excited.

Figure 32:
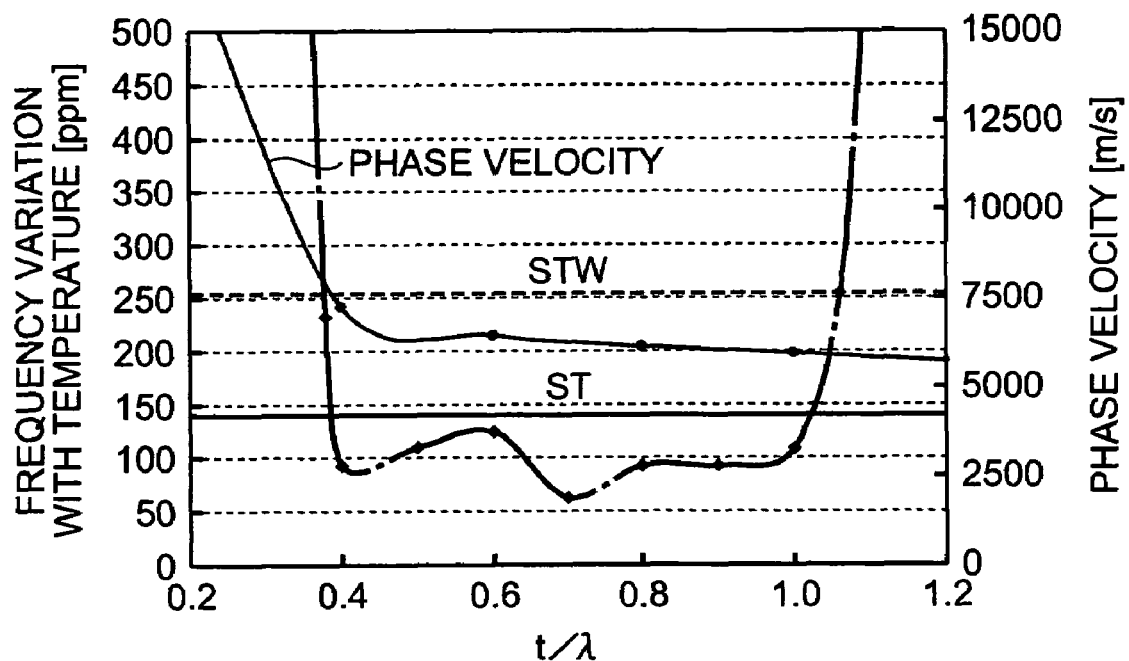
FIG. 32 is a graph showing the relationship among t/$\lambda$, the phase velocity, and the frequency variation with temperature in the sixth region according to the embodiment.

FIG. 32 shows the relationship among t/λ, the phase velocity, and the frequency variation with temperature. FIG. 32 shows that the range of t/λ in which frequency variation with temperature is smaller than that of STW-cut quartz is $0.375 \leq t/\lambda \leq 1.06$ (also refer to FIG. 17), in most of which a phase velocity of 5000 m/s or more is provided. In the range of t/λ, the phase velocity increases as t/λ decreases, providing a high-frequency band.

The relationship among t/λ, electromechanical coupling factor $K^2$, and frequency variation with temperature will be examined below.

Figure 33:
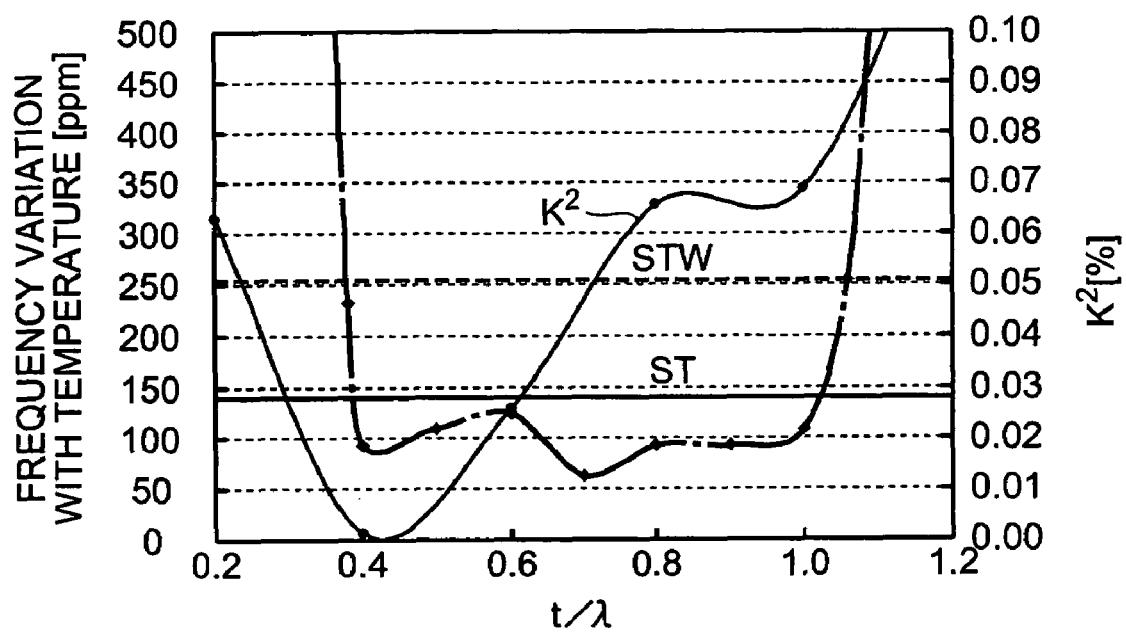
FIG. 33 is a graph showing the relationship among t/$\lambda$, the electromechanical coupling factor $K^2$, and the frequency variation with temperature in the sixth region according to the embodiment.

FIG. 33 shows the relationship among t/λ, the electromechanical coupling factor $K^2$, and the frequency variation with temperature. FIG. 33 shows that the range of t/λ in which frequency variation with temperature is smaller than that of STW-cut quartz is $0.375 \leq t/\lambda \leq 1.06$ (also refer to FIG. 27), in which an electromechanical coupling factor $K^2$ of 0.02 or more is provided. For $0.62 \leq t/\lambda \leq 1.06$, the electromechanical coupling factor $K^2$ amounts to 0.03 or more; for $0.67 \leq t/\lambda \leq 1.06$, the electromechanical coupling factor $K^2$ amounts to 0.04 or more; and for $0.71 \leq t/\lambda \leq 1.06$, the electromechanical coupling factor $K^2$ amounts to 0.05 or more.

Thus, as shown in FIG. 4, the embodiment offers the advantages of preventing mode coupling by setting the standardized substrate thickness t/λ to an appropriate value smaller than 3, allowing selection of Lamb wave with stable phase-velocity region.

FIG. 4 also shows that there are multiple high-frequency region modes in which the phase velocity is more than 5000 m/s by setting the standardized substrate thickness t/λ smaller than 3, allowing selection of a desired phase velocity (frequency).

The embodiment also allows provision of a Lamb-wave high-frequency resonator in which the frequency variation with temperature is smaller than those of the conventional ST-type Rayleigh wave resonator, STW-type SH-wave resonator, and AT-type Lamb-wave resonator, thus having a preferable temperature characteristic. It also provides an excellent temperature characteristic for practical use because the peak temperature of the frequency temperature deviation is close to 20° C. that is normal temperature.

The frequency variation with temperature in the first to sixth regions can be smaller than that of the STW type, providing a preferable frequency temperature characteristic. Furthermore, the electromechanical coupling factor $K^2$ can be set high, thus providing easily excited Lamb-wave high-frequency resonance.

According to the invention, the cut angle of the quartz substrate is simple because it is defined by Euler angles (0, θ, 0), and a wide range of angle θ and standardized substrate thickness t/λ can be set, and a desired temperature characteristic and frequency characteristic can be set in a desired frequency band. This offers the advantages of facilitating manufacturing to increase yields, thereby reducing manufacturing cost.

The invention provides a phase velocity in a high-frequency region, a preferable frequency temperature characteristic, and a high electromechanical coupling factor $K^2$ in each of the above-described six regions. Particularly in the first region, a wide range of angle θ of Euler angles (0, θ, 0) and a wide range of t/λ that satisfy the foregoing conditions can be provided, thus increasing options for manufacture.

In the fourth region, a high phase-velocity (high frequency) region and a high electromechanical coupling factor $K^2$ can be provided; for the sixth region, a high electromechanical coupling factor $K^2$ can be provided.

According to the invention, the characteristics are determined by the angle θ of Euler angles (0, θ, 0) and t/λ, as described above. The invention can provide a Lamb-wave high-frequency resonator having desired excellent characteristics by selecting a desired region from the first to sixth regions for the target characteristics and manufacturing conditions.

It will be obvious to those skilled in the art that the invention is not limited to the foregoing embodiment and that various changes and modifications may be made within the scope of the invention.

For example, although the foregoing embodiment includes the reflectors 25 and 26, it may be of an end reflection type having no reflectors.

Accordingly, the foregoing embodiment provides a Lamb-wave high-frequency resonator that provides high frequencies, having a high frequency temperature characteristic, and in which manufacturing cost is reduced.

The entire disclosure of Japanese Patent Application Nos:2005-002111, filed Jan. 7, 2005 and 2005-292126, filed Oct. 5, 2005 are expressly incorporated by reference herein.

What is claimed is:

1. A Lamb-wave high-frequency resonator comprising a comb-shaped IDT electrode for exciting a Lamb wave on one main surface of a quartz substrate, wherein the IDT electrode is formed such that the cut angle of the quartz substrate and the direction of propagation of the Lamb wave are expressed in Euler angles (0, θ, 0), wherein the relationship between the thickness t of the quartz substrate and the wavelength λ of the Lamb wave is set within the range expressed as $2.08 \leq t/\lambda \leq 2.82$ when the angle θ is within the range of $4 \leq \theta \leq 57.5$ degrees.

2. A Lamb-wave high-frequency resonator comprising a comb-shaped IDT electrode for exciting a Lamb wave on one main surface of a quartz substrate, wherein the IDT electrode is formed such that the cut angle of the quartz substrate and the direction of propagation of the Lamb wave are expressed in Euler angles (0, θ, 0), wherein the relationship between the thickness t of the quartz substrate and the wavelength λ of the Lamb wave is set within the range expressed as $0.975 \leq t/\lambda \leq 2.025$ when the angle θ is within the range of $6 \leq \theta \leq 33$ degrees.

3. A Lamb-wave high-frequency resonator comprising a comb-shaped IDT electrode for exciting a Lamb wave on one main surface of a quartz substrate, wherein the IDT electrode is formed such that the cut angle of the quartz substrate and the direction of propagation of the Lamb wave are expressed in Euler angles (0, θ, 0), wherein the relationship between the thickness t of the quartz substrate and the wavelength λ of the Lamb wave is set within the range expressed as $0.176 \leq t/\lambda \leq 1.925$ when the angle θ is within the range of $35 \leq \theta \leq 47.2$ degrees.

4. A Lamb-wave high-frequency resonator comprising a comb-shaped IDT electrode for exciting a Lamb wave on one main surface of a quartz substrate, wherein the IDT electrode is formed such that the cut angle of the quartz substrate and the direction of propagation of the Lamb wave are expressed in Euler angles (0, θ, 0), wherein the relationship between the thickness t of the quartz substrate and the wavelength λ of the Lamb wave is set within the range expressed as $2.878 \leq t/\lambda \leq 3$ when the angle θ is within the range of $2.7 \leq \theta \leq 16$ degrees.

* * * * *